US012751315B2

(12) United States Patent
Lee

(10) Patent No.: US 12,751,315 B2
(45) Date of Patent: Sep. 29, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventor: Injae Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 305 days.

(21) Appl. No.: 18/618,160

(22) Filed: Mar. 27, 2024

(65) Prior Publication Data

US 2024/0421014 A1 Dec. 19, 2024

(30) Foreign Application Priority Data

Jun. 15, 2023 (KR) ........................ 10-2023-0076628

(51) Int. Cl.
*H10W 74/10* (2026.01)
*H10W 70/60* (2026.01)
(Continued)

(52) U.S. Cl.
CPC ........ *H10W 74/114* (2026.01); *H10W 70/611* (2026.01); *H10W 70/65* (2026.01);
(Continued)

(58) Field of Classification Search
CPC . H10W 74/114; H10W 70/611; H10W 70/65; H10W 74/01; H10W 90/00; H10W 72/865; H10W 74/15; H10W 90/24; H10W 90/724; H10W 90/732; H10W 90/734; H10W 90/752; H10W 90/754;
(Continued)

(56) References Cited

U.S. PATENT DOCUMENTS 6,157,086 A * 12/2000 Weber ................ H10W 74/129 257/E23.125
8,785,254 B2 7/2014 Chun
(Continued)

FOREIGN PATENT DOCUMENTS

KR 10-1388423 B1 4/2014
KR 10-1391108 B1 4/2014
(Continued)

*Primary Examiner* — Syed I Gheyas
(74) *Attorney, Agent, or Firm* — Muir Patent Law, PLLC

(57) ABSTRACT

A semiconductor package includes a package substrate extending in a first direction, the package substrate having at least one first opening in a chip mounting region of the package substrate; a first semiconductor chip mounted in the chip mounting region on an upper surface of the package substrate; a plurality of second semiconductor chips sequentially stacked on the upper surface of the package substrate and spaced apart from the first semiconductor chip in the first direction; a sealant covering the first semiconductor chip and the plurality of second semiconductor chips on the package substrate, the sealant filling a gap between the first semiconductor chip and the package substrate and filling an interior of the at least one first opening of the package substrate; and a taping film attached on a lower surface of the package substrate to cover at least a portion of the sealant exposed in the first opening.

20 Claims, 19 Drawing Sheets

(51) Int. Cl.

| | |
|---|---|
| ***H10W 70/65*** | (2026.01) |
| ***H10W 74/01*** | (2026.01) |
| ***H10W 90/00*** | (2026.01) |
| *H10W 72/00* | (2026.01) |
| *H10W 74/15* | (2026.01) |
| *H10W 90/24* | (2026.01) |

(52) U.S. Cl.
CPC ........... *H10W 74/01* (2026.01); *H10W 90/00* (2026.01); *H10W 72/865* (2026.01); *H10W 74/15* (2026.01); *H10W 90/24* (2026.01); *H10W 90/724* (2026.01); *H10W 90/732* (2026.01); *H10W 90/734* (2026.01); *H10W 90/752* (2026.01); *H10W 90/754* (2026.01)

(58) Field of Classification Search
CPC . H10W 90/297; H10W 90/722; H10W 70/68; H10W 74/117; H10W 90/701; H10W 72/20; H10W 72/30; H10W 74/131; H10W 70/635
See application file for complete search history.

(56) References Cited

U.S. PATENT DOCUMENTS

| | | | | |
|---|---|---|---|---|
| 8,853,863 | B2 | 10/2014 | Liao et al. | |
| 9,947,644 | B2 * | 4/2018 | Hong | H10W 90/00 |
| 2012/0032328 | A1 * | 2/2012 | Lin | H10W 70/688 257/E21.503 |
| 2017/0040289 | A1 | 2/2017 | Lim et al. | |
| 2018/0076105 | A1 * | 3/2018 | Ki | H10W 74/016 |
| 2020/0051879 | A1 * | 2/2020 | Jang | H10W 70/68 |
| 2022/0375896 | A1 | 11/2022 | Du et al. | |

FOREIGN PATENT DOCUMENTS

| | | | |
|---|---|---|---|
| KR | 10-2017-0016551 | A | 2/2017 |
| KR | 10-1842093 | B1 | 3/2018 |

* cited by examiner

100

10

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2023-0076628, filed on Jun. 15, 2023 in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a semiconductor package including a plurality of different chips stacked on a package substrate and a manufacturing method thereof.

2. Description of the Related Art

In a multi-chip package (MCP), a controller chip may be mounted on a package substrate in a flip-chip manner. In the flip-chip manner, an underfill may be disposed and hardened below the controller chip to improve bondability and a reliability. However, in this case, it is important to provide a solder resist (SR) dam and a dispensing area for the underfill to prevent bleeding in which the underfill overflows. Thus, the solder resist (SR) dam and the dispensing area for the underfill may make it difficult to use an interior space efficiently, such as stacking multi-chip or securing process margins.

SUMMARY

Example embodiments provide a semiconductor package having an internal space to stack a plurality of chips efficiently.

Example embodiments provide a method of manufacturing the semiconductor package.

According to example embodiments, a semiconductor package includes a package substrate, the package substrate having a first opening in a chip mounting region of the package substrate; a first semiconductor chip mounted in the chip mounting region on an upper surface of the package substrate; a plurality of second semiconductor chips sequentially stacked on the upper surface of the package substrate and spaced apart from the first semiconductor chip in a first horizontal direction; a sealant covering the first semiconductor chip and the plurality of second semiconductor chips on the package substrate, the sealant filling a gap between the first semiconductor chip and the package substrate and filling an interior of the first opening of the package substrate; and a taping film attached on a lower surface of the package substrate to cover at least a portion of the sealant exposed in the first opening.

According to example embodiments, a semiconductor package includes a package substrate having a first opening in a chip mounting region and a plurality of first substrate pads in the chip mounting region, the package substrate having a plurality of second substrate pads in a region surrounding the chip mounting region; a first semiconductor chip mounted on the chip mounting region and having a plurality of first chip pads; a plurality of first conductive connection members electrically connecting the plurality of first chip pads to the plurality of the first substrate pads, respectively; a plurality of second semiconductor chips stacked on an upper surface of the package substrate and having a front surface and backside surface facing each other, each of the plurality of second semiconductor chips having a plurality of second chip pads disposed on the front surface; a plurality of adhesive films, each of the plurality of adhesive films attached to the backside surface of each of the plurality of second semiconductor chips; a plurality of second conductive connection members electrically connecting the plurality of second chip pads to the plurality of the second substrate pads, respectively; and a sealant covering the first semiconductor chip, the plurality of second semiconductor chips and the second conductive connection members on the package substrate, the sealant filling a gap between the first semiconductor chip and the package substrate and filling an interior of the at least one first opening of the package substrate.

According to example embodiments, a semiconductor package includes a package substrate having a first opening in a chip mounting region and a plurality of first substrate pads in the chip mounting region, the package substrate having a plurality of second substrate pads in a region excluding the chip mounting region; a first semiconductor chip mounted on the chip mounting region and a plurality of first chip pads on the first semiconductor chip; a plurality of first conductive connection members electrically connecting the plurality of first chip pads to the plurality of the first substrate pads, respectively; a plurality of second semiconductor chips stacked on an upper surface of the package substrate and having a front surface and backside surface facing each other, each of the plurality of second semiconductor chips having a plurality of second chip pads disposed front surface; a plurality of adhesive films, each of the plurality of adhesive films attached to the backside surface of each of the plurality of second semiconductor chips; a plurality of second conductive connection members electrically connecting the plurality of second chip pads to the plurality of the second substrate pads, respectively; a sealant covering the first semiconductor chip, the plurality of second semiconductor chips and the second conductive connection members on the package substrate, the sealant filling a gap between the first semiconductor chip and the package substrate and filling an interior of the first opening of the package substrate; and taping film attached on a lower surface of the package substrate such that at least a portion of the sealant exposed in the first opening is covered, wherein a lower surface of a portion of the sealant filling the interior of the first opening is coplanar with the lower surface of the package substrate, wherein a width of the first opening in a first direction is smaller than a width of the first opening in a second direction perpendicular to the first direction, wherein the width of the first opening in the second direction is less than or equal to a length of the first semiconductor chip in the second direction.

According to example embodiments, a method of manufacturing a package substrate includes providing a substrate including a first opening in a chip mounting region of the substrate, the chip mounting region being on a first side of the substrate; mounting a semiconductor chip on the chip mounting region of the substrate; providing a sealant in a gap between the semiconductor chip and the substrate and in the first opening; removing a portion of the sealant protruding from a second side of the substrate opposite to the first side; and providing a taping film on the second side of the substrate covering the sealant in the first opening.

According to example embodiments, in a method of manufacturing a semiconductor package, a package substrate is provided to extend in a first direction and have at least one through slit in a chip mounting region. A first semiconductor chip is mounted on the chip mounting region of an upper surface of the package substrate. A plurality of second semiconductor chips are sequentially stacked on the upper surface of the package substrate to be spaced apart from the first semiconductor chip in the first direction. A sealant is formed to cover the first semiconductor chip and the plurality of second semiconductor chips, fill a gap between the first semiconductor chip and the package substrate and fill an interior of the through slit of the package substrate. And, a taping film is attached to a lower surface of the package substrate to cover at least a portion of the sealant exposed form the through slit.

According to example embodiments, a semiconductor package includes a first semiconductor chip mounted an upper surface of a package substrate, a plurality of second semiconductor chips stacked on the upper surface of the package substrate to be spaced apart from the first semiconductor chip, a sealant covering the first semiconductor chip and the plurality of second semiconductor chips and a taping film attached on a lower surface of the package substrate. The sealant fills a gap between the first semiconductor chip and the package substrate. At least one through slit is provided in the package substrate in a chip mounting region to penetrate the package substrate. A portion of the sealant fills an interior of the through slit. A portion of the sealant may fill the gap between a lower surface of the first semiconductor chip and the upper surface of the package substrate to extend through the through slit, thereby serving as an underfill as well as a sealant.

Accordingly, because there is no need for an additional region for a dispensing area for underfill and a solder resist dam, it may be possible to efficiently use an interior space of the package. Thus, it may be possible to implement a high-capacity package and secure a process margin.

DETAILED DESCRIPTION OF EXAMPLE EMBODIMENTS

Hereinafter, example embodiments will be explained in detail with reference to the accompanying drawings.

Figure 1:
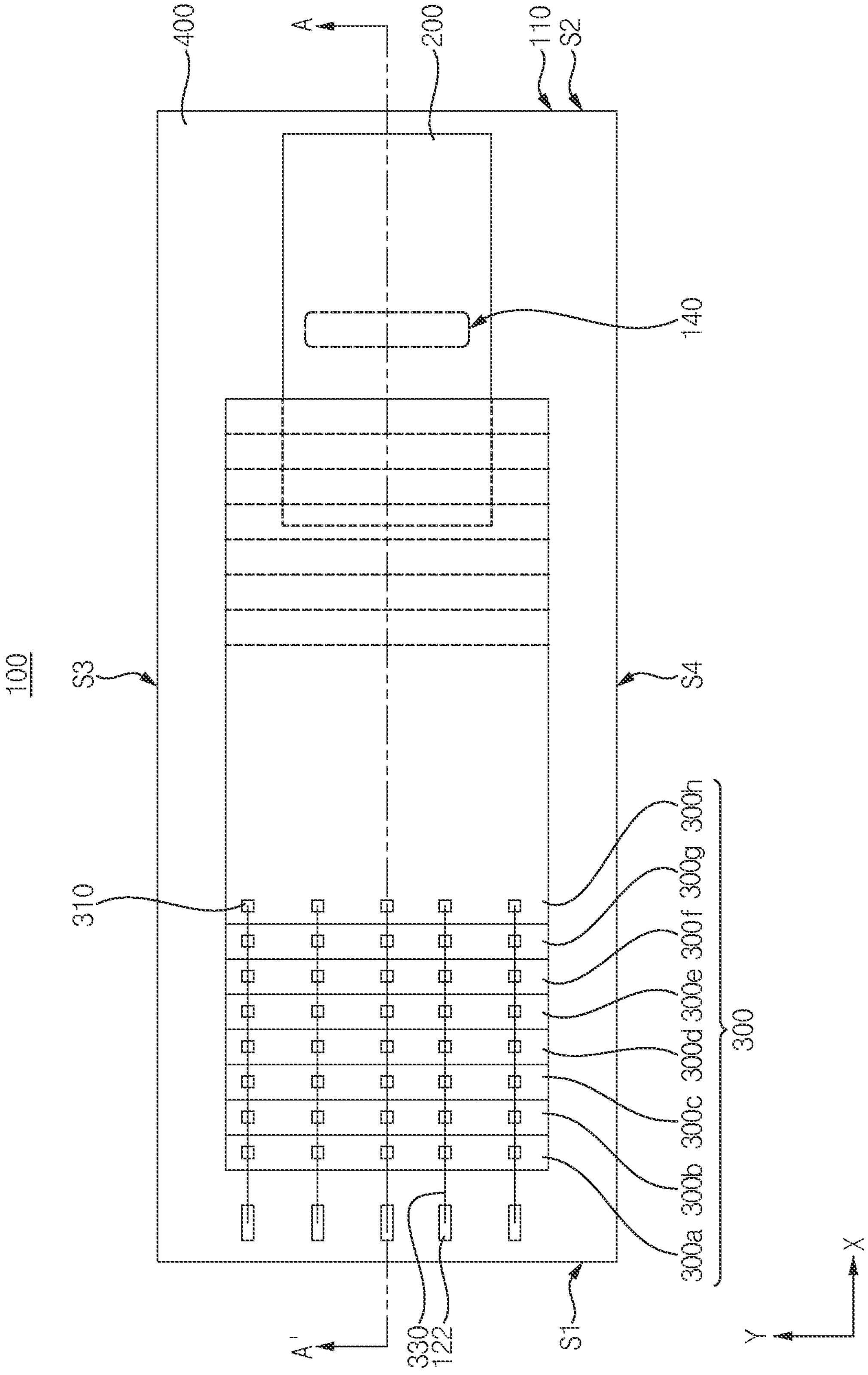
FIG. 1 is a plan view illustrating a semiconductor package in accordance with example embodiments.
Figure 2:
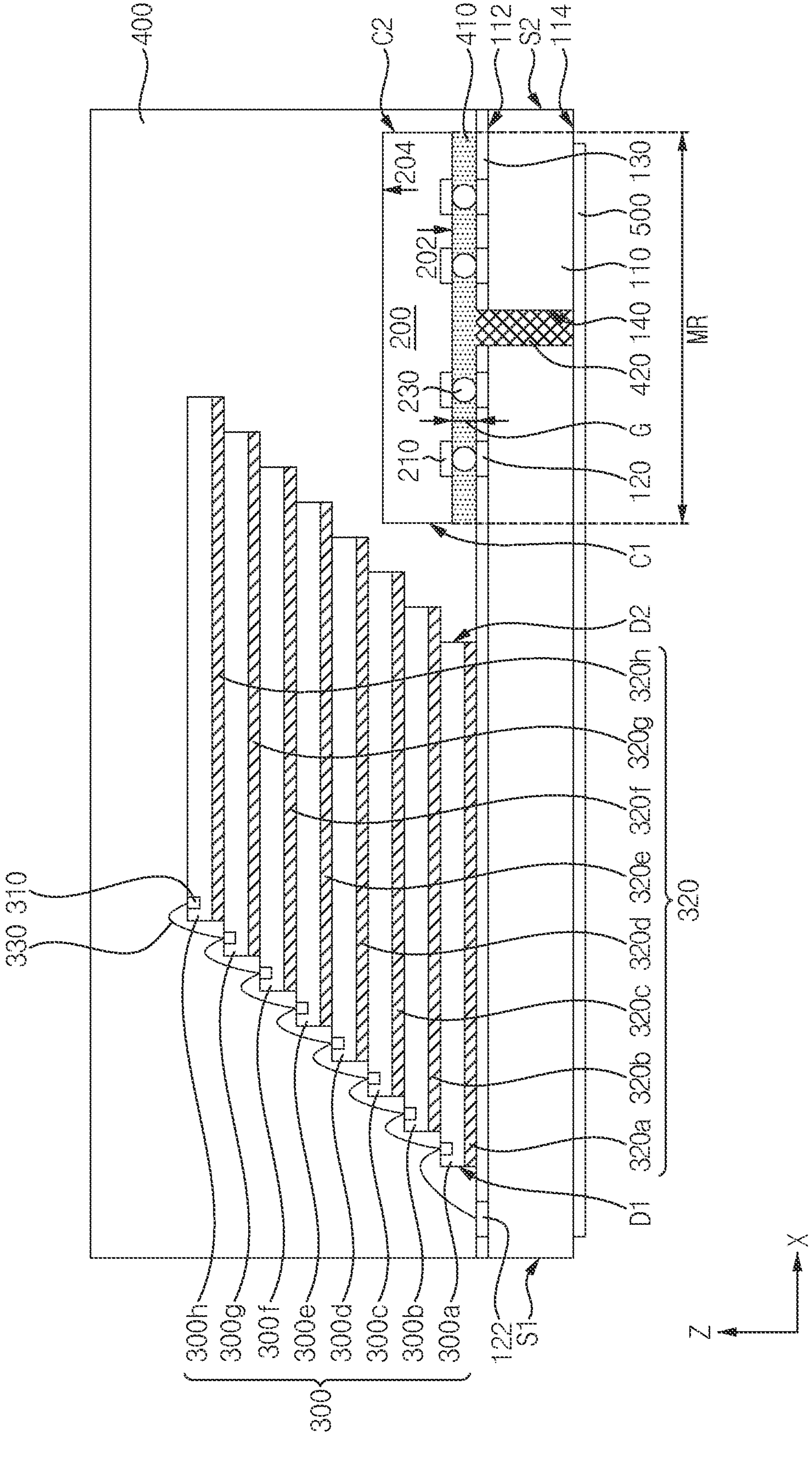
FIG. 2 is a cross-sectional view taken along the line A-A' in FIG. 1.
Figure 3:
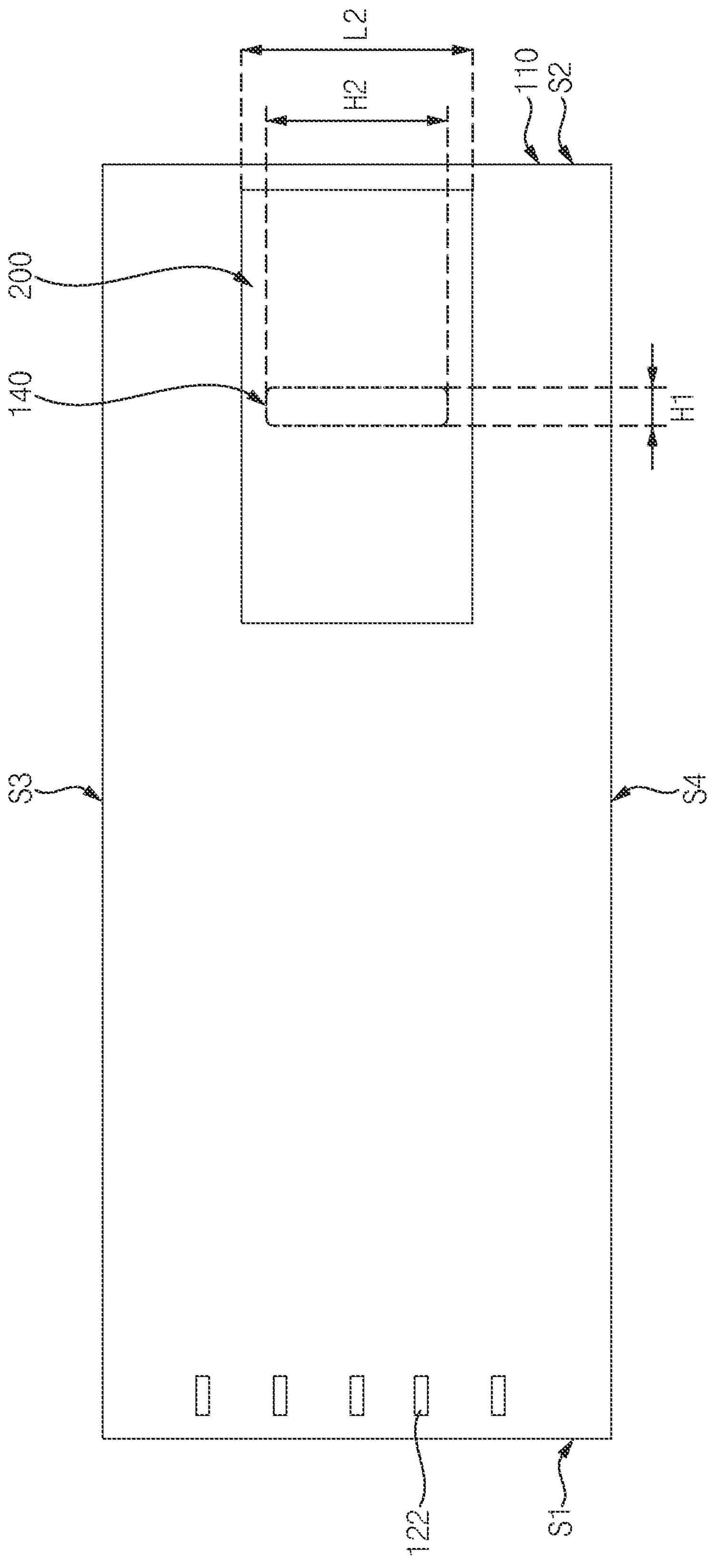
FIG. 3 is a plan view illustrating a package substrate of a semiconductor package in FIG. 1.
Figure 4:
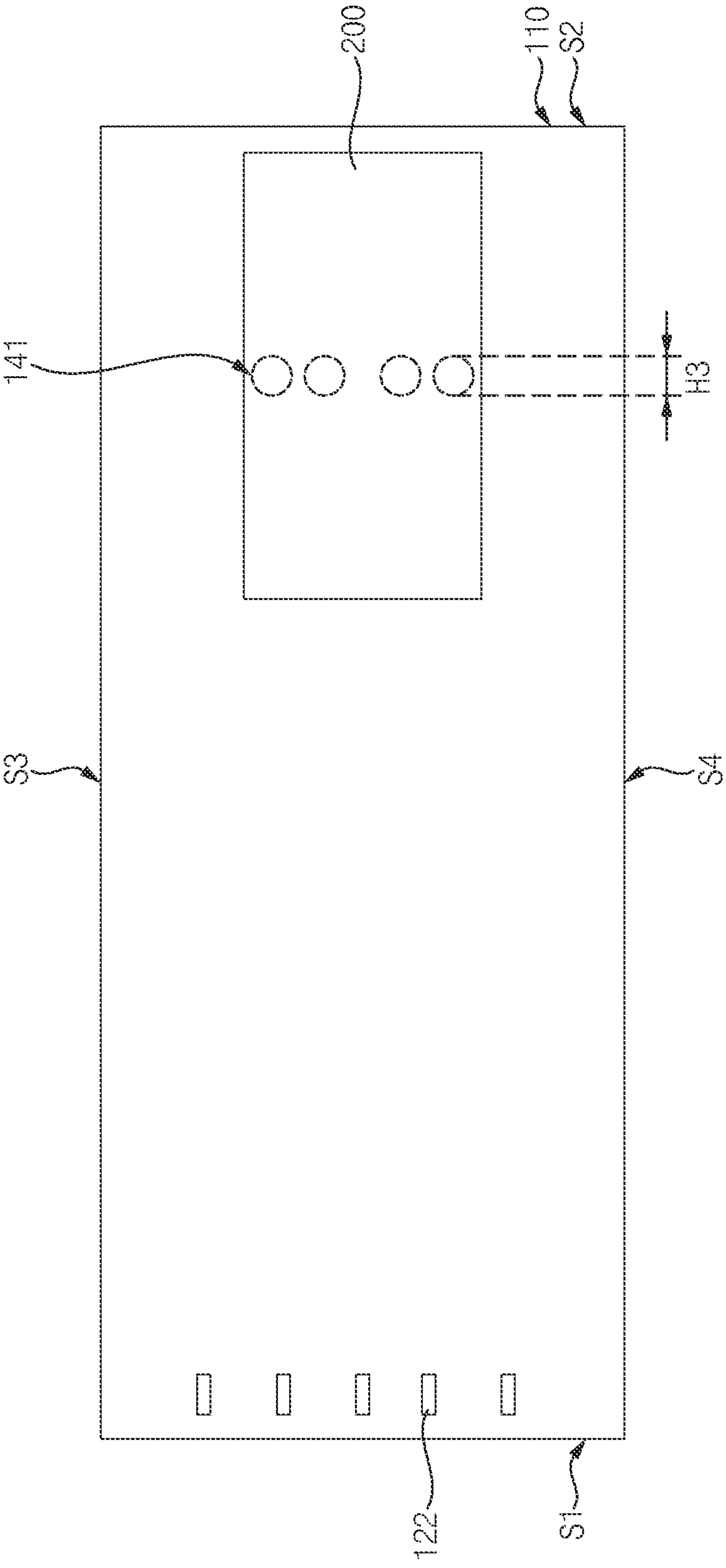
FIG. 4 is a plan view illustrating a package substrate in accordance with an example embodiment.

FIG. 1 is a plan view illustrating a semiconductor package in accordance with example embodiments. FIG. 2 is a cross-sectional view taken along the line A-A' in FIG. 1. FIG. 3 is a plan view illustrating a package substrate of the semiconductor package in FIG. 1. FIG. 4 is a plan view illustrating a package substrate in accordance with a different example embodiment.

Referring to FIGS. 1 to 4, a semiconductor package 100 may include a package substrate 110, at least one first semiconductor chip 200, a plurality of second semiconductor chips 300, a sealant 400 and a taping film 500. The semiconductor package 100 may further include first conductive connection members 230 that electrically connect the first semiconductor chip 200 to the package substrate 110. In addition, the semiconductor package 100 may further include second conductive connection members 330 that electrically connect the plurality of second semiconductor chips 300 to the package substrate 110.

Additionally, the semiconductor package 100 may be a multi-chip package (MCP) including different types of semiconductor chips. The semiconductor package 100 may be a System In Package (SIP) including a plurality of semiconductor chips stacked or arranged in one package to perform all or most of the functions of an electronic system.

In example embodiments, the package substrate 110 may be a substrate having an upper surface 112 and a lower surface 114 opposite to the upper surface 112. For example, the package substrate 110 may include a printed circuit board (PCB), a flexible substrate, a tape substrate, etc. The printed circuit board may be a multilayer circuit board having vias and various circuits therein. The package substrate 110 may include internal wires that serve as channels for electrical connection between the first semiconductor chip 200 and the plurality of second semiconductor chips 300.

The package substrate 110 may include a first side portion S1 and a second side portion S2 extending in a direction parallel with a second direction (Y direction or second horizontal direction) opposite to each other, and a third side portion S3 and a fourth side portion S4 extending in a direction parallel with a first direction (X direction or first horizontal direction) opposite to each other.

The package substrate 110 may have a plurality of first substrate pads 120 disposed in a chip mounting region MR and a plurality of second substrate pads 122 disposed along the first side portion S1 of the package substrate 110. The plurality of first substrate pads 120 and the plurality of second substrate pads 122 may be respectively connected to wires. The wires may extend on the upper surface 112 of the package substrate 110 or inside the package substrate 110. For example, at least a portion of the wire may be used as the substrate pad as a landing pad.

Although some substrate pads are illustrated, the number, shapes and locations of the substrate pads are illustrated as examples, and thus, the invention is not limited thereto. Since the wirings as well as the substrate pads are well known in the art to which the present inventive concept pertains, illustration and description concerning the above elements will be omitted.

A first insulation layer 130 may be formed on the upper surface 112 of the package substrate 110 to expose the first and second substrate pads 120 and 122. The first insulation layer 130 may cover the entire upper surface 112 of the package substrate 110 except for the first and second substrate pads 120 and 122. For example, the first insulation layer may include a solder resist.

The package substrate 110 may have the chip mounting region MR in a central region thereof. As will be described below, the chip mounting region MR may be a region where the first semiconductor chip 200 as a controller chip is mounted. The chip mounting region MR may be disposed in a region adjacent to the second side portion S2 of the package substrate 110. The chip mounting region MR may have a rectangular shape.

At least one opening 140 (e.g., a first opening) may be provided in the chip mounting region MR to penetrate the package substrate 110. The opening 140 may have a rectangular, circular or oval shape, when viewed from a plan view. However, the invention is not limited thereto, and the opening 140 may have a different shape. The opening 140 may penetrate through the package substrate 110 from the upper surface 112 to the lower surface 114 thereof. For example, the opening 140 may be a through slit having a generally linear shape when viewed from a plan view. For example, the opening 140 may be formed in an opening region of the package substrate 110 that has a general linear shape. For example, the shape of the opening 140 may be coextensive with the shape of the opening region of the package substrate 110.

As illustrated in FIG. 3, for example, the opening 140 may have a rectangular shape. A first width H1 in the first direction (X direction) of the opening 140 may be smaller than a second width H2 in the second direction (Y direction) of the opening 140. Corners of the opening 140 may have a curved shape. The second width H2 in the second direction (Y direction) of the opening 140 may be less than or equal to a first length L2 in the second direction (Y direction) of the first semiconductor chip 100. In addition, the first width H1 of the opening 140 may be within a range of 0.1 mm to 0.3 mm.

As illustrated in FIG. 4, for example, a plurality of through via holes 141 (e.g., a plurality of openings) may be disposed to be spaced apart along the second direction (Y direction). The plurality of through via holes 141 may each have a circular shape. A diameter of each of the plurality of through via holes 141 may have a third width H3. For example, the third width H3 may be within a range of 0.1 mm to 0.4 mm. The through via holes 141 may be formed in a regular series and may each be formed in the opening region of the package substrate 110. The number of the through via holes may be two or more, for example, four. However, the present invention is not limited to this, so the number of the through via holes may be changed.

As illustrated in FIG. 2, the opening 140 may be disposed to penetrate the package substrate 110. The opening 140 may be disposed in a central portion of the chip mounting region MR. The opening 140 may be disposed below the first semiconductor chip 200. Although one opening or some through via holes are illustrated, the number, shapes and locations of the opening or through via holes are illustrated as examples, and thus, the invention is not limited thereto.

In example embodiments, the first semiconductor chip 200 may mounted on the chip mounting region MR of the package substrate 110. The first semiconductor chip 200 may be mounted on the package substrate 110 via the plurality of first conductive connection members 230. The first semiconductor chip 200 may be disposed such that a front surface 202 on which a plurality of first chip pads 210 are formed, that is, an active surface, faces the package substrate 110. The first semiconductor chip 200 may have a rectangular shape when viewed from plan view. The plurality of first chip pads 210 may be arranged on the entire front surface 202 of the first semiconductor chip 200 in an array form.

The first semiconductor chip 200 may be a logic chip including a logic circuit. The logic chip may be a controller that controls memory chips. The first semiconductor chip may be a processor chip such as an ASIC and an application processor (AP) serving as a host such as CPU, GPU, or SOC.

The first semiconductor chip 200 may be mounted on the package substrate 110 by a flip chip bonding method. The plurality of first chip pads 210 of the first semiconductor chip 200 may be electrically connected to the plurality of first substrate pads 120 of the package substrate 110 by the plurality of conductive bumps 230, for example, solder bumps. A gap G may be formed between the first insulation layer 130 on the upper surface 112 of the package substrate 110 and the front surface 202 of the first semiconductor chip 200 by the plurality of conductive bumps 230.

In example embodiments, the plurality of second semiconductor chips 300 may be attached on the package substrate 110 by a plurality of adhesive films 320. The plurality of second semiconductor chips 300*a*, 300*b*, 300*c*, 300*d*, 300*e*, 300*f*, 300*g* and 300*h* may be sequentially attached on the package substrate 110 by the plurality of adhesive films 320*a*, 320*b*, 320*c*, 320*d*, 320*e*, 320*f*, 320*g* and 320*h*. For example, each second semiconductor chip 300 may be attached to an adjacent second semiconductor chip 300 by one of the plurality of adhesive films 320. The lowermost second semiconductor chip 300*a* may be attached to the package substrate 110 by the lowermost adhesive film 320*a*.

The plurality of second semiconductor chips 300 may be disposed adjacent to the first side portion S1 of the package substrate 110. The plurality of second semiconductor chips 300 may be spaced apart from the first semiconductor chip 200 in the first direction (X direction).

A planar area of each of the plurality of second semiconductor chips 300 may be greater than a planar area of the first semiconductor chip 200. When viewed from a plan view, some relatively highly arranged chips (for example, 300*e*, 300*f*, 300*g*, and 300*h*) of the plurality of second semiconductor chips 300 may be disposed over the first semiconductor chip 200 and partially overlap with the first semiconductor chip 200.

The plurality of second semiconductor chips may include a memory chip including a memory circuit. For example, the plurality of second semiconductor chips may include volatile memory devices such as SRAM devices, DRAM devices, etc. and nonvolatile memory devices such as flash memory devices, PRAM devices, MRAM devices, RRAM devices, etc.

The plurality of second semiconductor chips 300*a*, 300*b*, 300*c*, 300*d*, 300*e*, 300*f*, 300*g* and 300*h* may be sequentially attached on the package substrate 110 by the plurality of adhesive films 320*a*, 320*b*, 320*c*, 320*d*, 320*e*, 320*f*, 320*g* and 320*h* such as a die attach film (DAF) by a die attach process.

The plurality of second semiconductor chips 300 may be disposed such that a backside surface opposite to a front surface on which the plurality of second chip pads 310 are formed, that is, a non-active surface faces the package substrate 110. When viewed from a plan view, each of the plurality of second semiconductor chips 300 may have a quadrangular shape having four sides.

For example, the plurality of adhesive films 320*a*, 320*b*, 320*c*, 320*d*, 320*e*, 320*f*, 320*g* and 320*h* may be attached to the backside surface of the plurality of second semiconductor chips 300*a*, 300*b*, 300*c*, 300*d*, 300*e*, 300*f*, 300*g* and 300*h*, and the plurality of second semiconductor chips 300*a*,

300*b*, 300*c*, 300*d*, 300*e*, 300*f*, 300*g* and 300*h* to which the plurality of adhesive films 320*a*, 320*b*, 320*c*, 320*d*, 320*e*, 320*f*, 320*g* and 320*h* is attached may be sequentially attached on the package substrate 110 by a thermal compression process. The plurality of second semiconductor chips 300 may be pressed onto the package substrate 110 by a die attaching tool, and then may be heated to a high temperature by a heater block inside a support system that supports the package substrate 110.

The plurality of second semiconductor chips 300*a*, 300*b*, 300*c*, 300*d*, 300*e*, 300*f*, 300*g* and 300*h* may be sequentially offset aligned. For example, the plurality of second semiconductor chips 300 may be stacked in a cascade structure. The plurality of second semiconductor chips 300 may be sequentially offset aligned in the first direction (X direction) of the package substrate 110.

The number and the sizes of the plurality of second semiconductor chips 300*a*, 300*b*, 300*c*, 300*d*, 300*e*, 300*f*, 300*g* and 300*h* may be determined in consideration of a required capacity.

The number, sizes, arrangements, etc. of the plurality of second semiconductor chips are provided as examples, and it will be understood that the present inventive concept is not limited thereto. Additionally, although only a few second chip pads are illustrated in the figures, the number, structures, shapes, and arrangements of the second chip pads are provided as examples, and it will be understood that the present inventive concept is not limited thereto.

The plurality of second semiconductor chips 300 may be electrically connected to the package substrate 110 via the plurality of second conductive connection members 330.

Specifically, the plurality of second chip pads 310 of the plurality of second semiconductor chips 300 may be connected to the plurality of second substrate pads 122 on the upper surface 112 of the package substrate 110 via a plurality of bonding wires as the second conductive connection members 330.

In example embodiments, the sealant 400 may cover the first semiconductor chip 100, the plurality of second semiconductor chips 200 and the plurality of bonding wires 330 on the upper surface 112 of the package substrate 110. The sealant may be or include a thermosetting resin, for example, epoxy molding compound (EMC).

The sealant 400 may include a first portion 410 and a second portion 420.

The first portion 410 of the sealant 400 may fill the gap G between the lower surface 202 of the first semiconductor chip 200 and the upper surface 112 of the package substrate 110. The first portion 410 of the sealant 400 may serve as underfill below the first semiconductor chip 200 that is mounted by the flip chip bonding method.

A lowest semiconductor chip 300*a* of the plurality of second semiconductor chips 300 may be disposed to be directly attached to the package substrate 110. A portion of the sealant 400 may fill between the lowest semiconductor chip 300*a* and the first semiconductor chip 200. For example, an entire region between the lowest semiconductor chip 300*a* and the first semiconductor chip 200 may be filled by a portion of the sealant 400.

As illustrated in FIG. 2, the lowest second semiconductor chip 300*a* may have a first side surface D1 adjacent to the second package substrate pad 122 and a second side surface D2 opposite to the first side surface D1 and adjacent to the first semiconductor chip 200. In addition, the first semiconductor chip 200 may have a first side surface C1 adjacent to the second side surface D2 of the lowest second semiconductor chip 300*a* and a second side surface C2 opposite to the first side surface C1. Only the sealant 400 may fill between the second side surface D2 of the lowest semiconductor chip 300*a* and the first side surface C1 of the first semiconductor chip 200.

The second portion 420 of the sealant 400 may extend through the opening 140 of the package substrate 110 disposed below the first semiconductor chip 200. The second potion 420 of the sealant 400 may fill the opening 140 and may extend through the opening 140 such that a lower portion of the second portion 420 is exposed in the opening 140. A lower surface of the second portion 420 of the sealant 400 that fills an interior of the opening 140 may be coplanar with the lower surface 114 of the package substrate 110.

In example embodiments, the taping film 500 may be disposed on the lower surface 114 of the package substrate 110 to cover the lower surface of the second portion 420 of the sealant 400 that extends through the opening 140. For example, the taping film may be or include a polymer synthetic resin.

In particular, the taping film 500 may have a rectangular shape when viewed from a plan view. The taping film 500 may be attached on the lower surface 114 of the package substrate 110 to cover a portion of the sealant 400 exposed in the opening 140. The taping film 500 may cover at least the entire lower surface of the second portion 420 of the sealant 400 that is exposed in the opening 140.

As mentioned above, the semiconductor package 100 may include the first semiconductor chip 200 mounted the upper surface 112 of the package substrate 110, the plurality of second semiconductor chips 300 stacked on the upper surface 112 of the package substrate 110 to be spaced apart from the first semiconductor chip 100, the sealant 400 covering the first semiconductor chip 200 and the plurality of second semiconductor chips 300, and the taping film 500 attached on the lower surface 114 of the package substrate 110.

The sealant 400 may fill the gap G between the lower surface 202 of the first semiconductor chip 200 connected in a flip chip bonding method and the upper surface 112 of the package substrate 110. The package substrate 110 may have the opening 140 in the chip mounting region MR to penetrate the package substrate 110. The second portion 420 of the sealant 400 may fill the interior of the opening 140 provided below the first semiconductor chip 200.

Accordingly, the first portion 410 of the sealant 400 may fill the gap G between the lower surface 202 of the first semiconductor chip 200 and the upper surface 112 of the package substrate 110 and the second portion 420 may extend through the interior of the opening 140, such that the sealant 400 may thereby serve as an underfill as well as a sealant. Because there is no need for an additional area for a dispensing area for underfill and a Solder Resist dam, it may be possible to efficiently use an interior space of the package. Thus, it may be possible to implement a high-capacity package and secure a process margin.

Hereinafter, a method of manufacturing the semiconductor package of FIG. 1 will be described.

Figure 5:
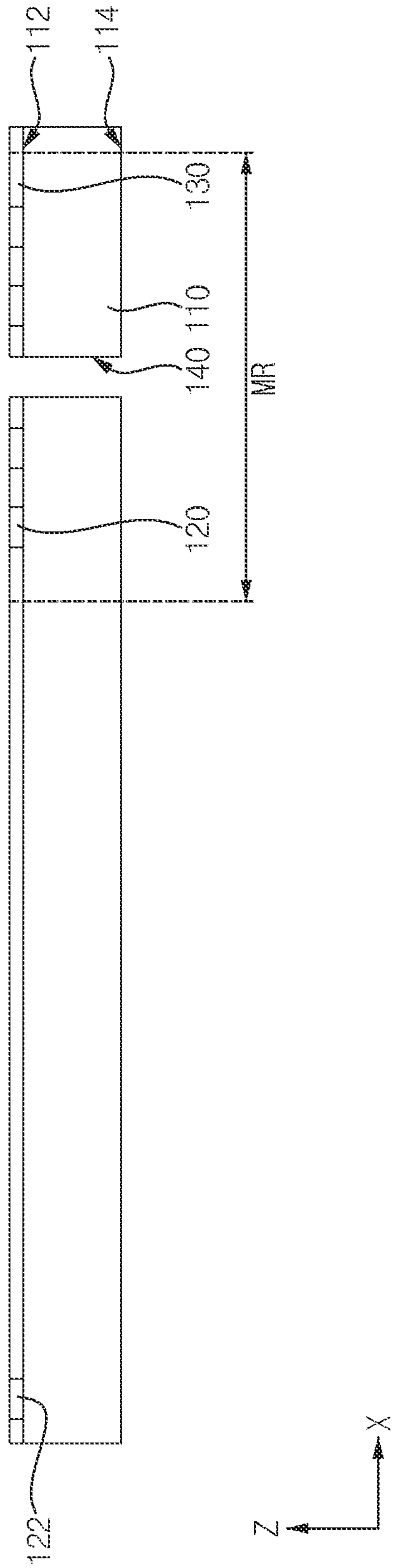
FIGS. 5 to 14 are views illustrating a method of manufacturing a semiconductor package in accordance with example embodiments.
Figure 6:
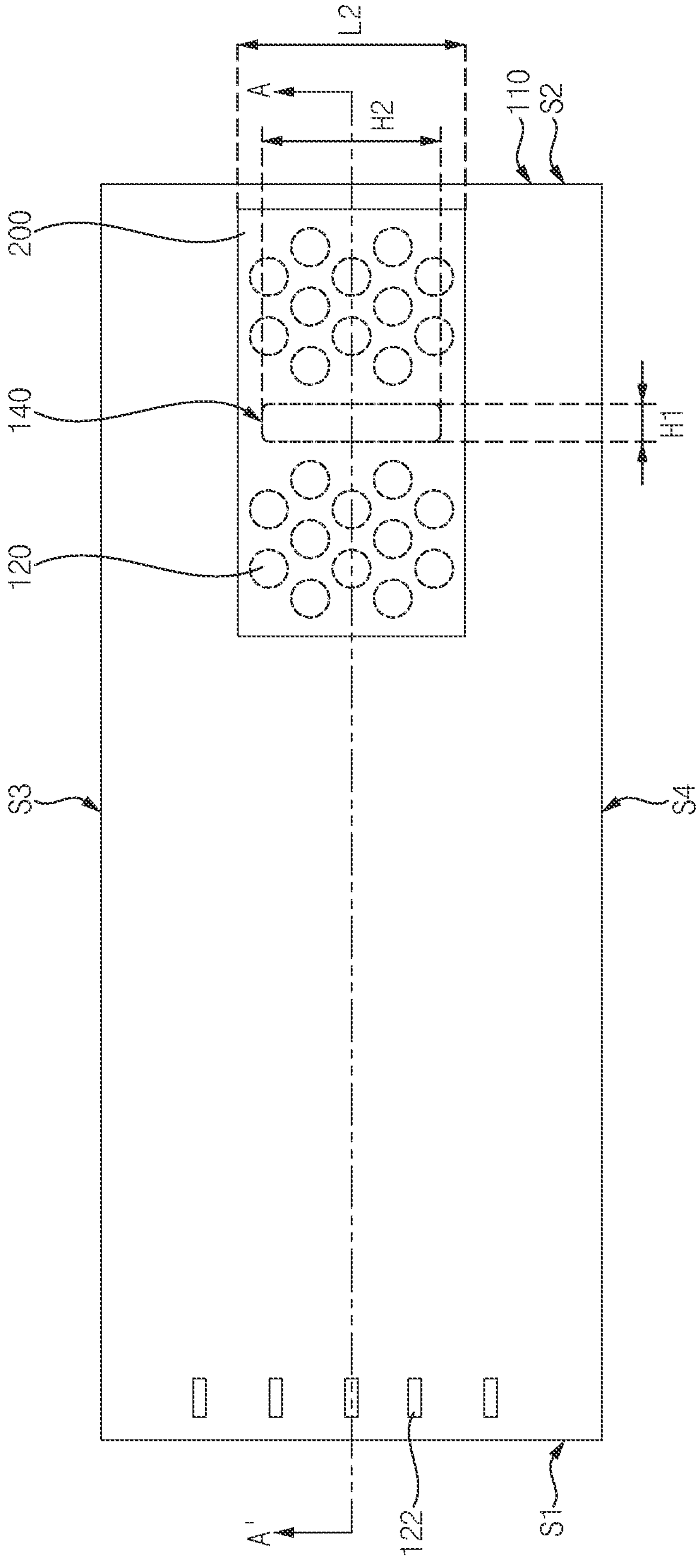

FIGS. 5 to 14 are views illustrating a method of manufacturing a semiconductor package in accordance with example embodiments. FIGS. 5 and 7 to 14 are cross-sectional views illustrating a method of manufacturing a semiconductor package in accordance with example embodiments. FIG. 6 is a plan view illustrating a first semiconductor chip mounted on a package substrate of FIG. 5.

Figure 7:
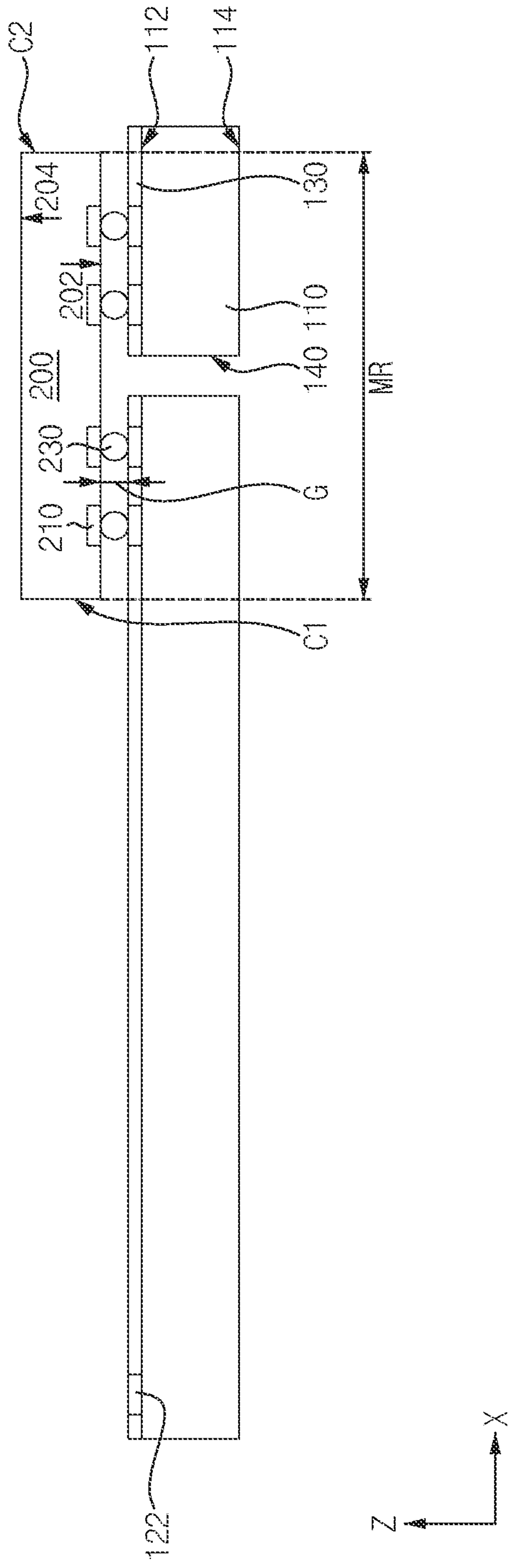

Referring to FIGS. 5 to 7, a package substrate 110 having at least one opening 140 may be provided, and a first semiconductor chip 200 may be mounted on a chip mounting region MR of the package substrate 110. The opening 140 may be formed in the chip mounting region MR to penetrate the package substrate 110.

As illustrated in FIG. 5, the package substrate 110 may be a substrate having an upper surface 112 and a lower surface 114 opposite to the upper surface 112. For example, the package substrate 110 may include a printed circuit board (PCB), a flexible substrate, a tape substrate, etc. The printed circuit board may be a multilayer circuit board having vias and various circuits therein. The package substrate 110 may include internal wires that serve as channels for electrical connection between semiconductor chips to be mounted.

The package substrate 110 may include a first side portion S1 and a second side portion S2 extending in a direction parallel with a second direction (Y direction) and opposite to each other, and a third side portion S3 and a fourth side portion S4 extending in a direction parallel with a first direction (X direction) and opposite to each other.

The package substrate 110 may have the chip mounting region MR on which the first semiconductor chip as a controller chip is mounted. The chip mounting region MR may be provided on a region adjacent to the second side portion S2. For example, when viewed from a plan view, the chip mounting region MR may have a rectangular shape.

The package substrate 110 may have a plurality of first substrate pads 120 disposed in the chip mounting region MR and a plurality of second substrate pads 122 disposed along the first side portion S1 of the package substrate 110. The plurality of first substrate pads 120 and the plurality of second substrate pads 122 may be respectively connected to the wires. The wires may extend in the upper surface 112 of the package substrate 110 or inside the package substrate 110. For example, at least a portion of the wire may be used as the substrate pad as a landing pad.

Although some substrate pads are illustrated, the number, shapes and locations of the substrate pads are illustrated as examples, and thus, the invention is not limited thereto. Since the wirings as well as the substrate pads are well known in the art to which the present inventive concept pertains, illustration and description concerning the above elements will be omitted.

A first insulation layer 130 may be formed on the upper surface 112 of the package substrate 110 to expose the first and second substrate pads 120 and 122. The first insulation layer 130 may cover the entire upper surface 112 of the package substrate 110 except for the first and second substrate pads 120 and 122. For example, the first insulation layer may include a solder resist.

As illustrated in FIG. 5, the opening 140 may be provided in the chip mounting region MR to penetrate the package substrate 110. The opening 140 may have a rectangular, circular or oval shape, when viewed from a plan view. However, the inventive concept is not limited thereto, and the opening may have another shape.

For example, the opening 140 may have the rectangular shape. As illustrated in FIG. 6, a first width H1 in the first direction (X direction) of the opening 140 may be smaller than a second width H2 in the second direction (Y direction) of the opening 140. Corners of the opening 140 may have a curved shape. The second width H2 in the second direction (Y direction) of the opening 140 may be less than or equal to a first length L2 in the second direction (Y direction) of the first semiconductor chip 100. In addition, the first width H1 of the opening 140 may be within a range of 0.1 mm to 0.3 mm.

As illustrated in FIGS. 6 and 7, the first semiconductor chip 200 may be mounted on the chip mounting region MR of the package substrate 110. The opening 140 may be disposed in the chip mounting region MR below the first semiconductor chip 200.

In example embodiments, the first semiconductor chip 200 may be mounted on the package substrate 110 via a plurality of first conductive connection members 230. The first semiconductor chip 200 may be disposed such that a front surface 202 on which a plurality of first chip pads 210 are formed, that is, an active surface, faces the package substrate 110. The first semiconductor chip 200 may have a rectangular shape when viewed from plan view. The plurality of first chip pads 210 may be arranged on the entire front surface 202 of the first semiconductor chip 200 in an array form.

The first semiconductor chip 200 may be, for example, a logic chip including a logic circuit. The logic chip may be a controller that controls memory chips. The first semiconductor chip may be a processor chip such as an ASIC, an application processor (AP) serving as a host such as CPU, GPU, or SOC.

The first semiconductor chip 200 may be mounted on the package substrate 110 by a flip chip bonding method. The plurality of first chip pads 210 of the first semiconductor chip 200 may be electrically connected to the plurality of first substrate pads 120 of the package substrate 110 by the plurality of conductive bumps 230, for example, solder bumps. A gap G may be formed between the first insulation layer 130 on the upper surface 112 of the package substrate 110 and the front surface 202 of the first semiconductor chip 200 by the plurality of conductive bumps 230.

Figure 8:
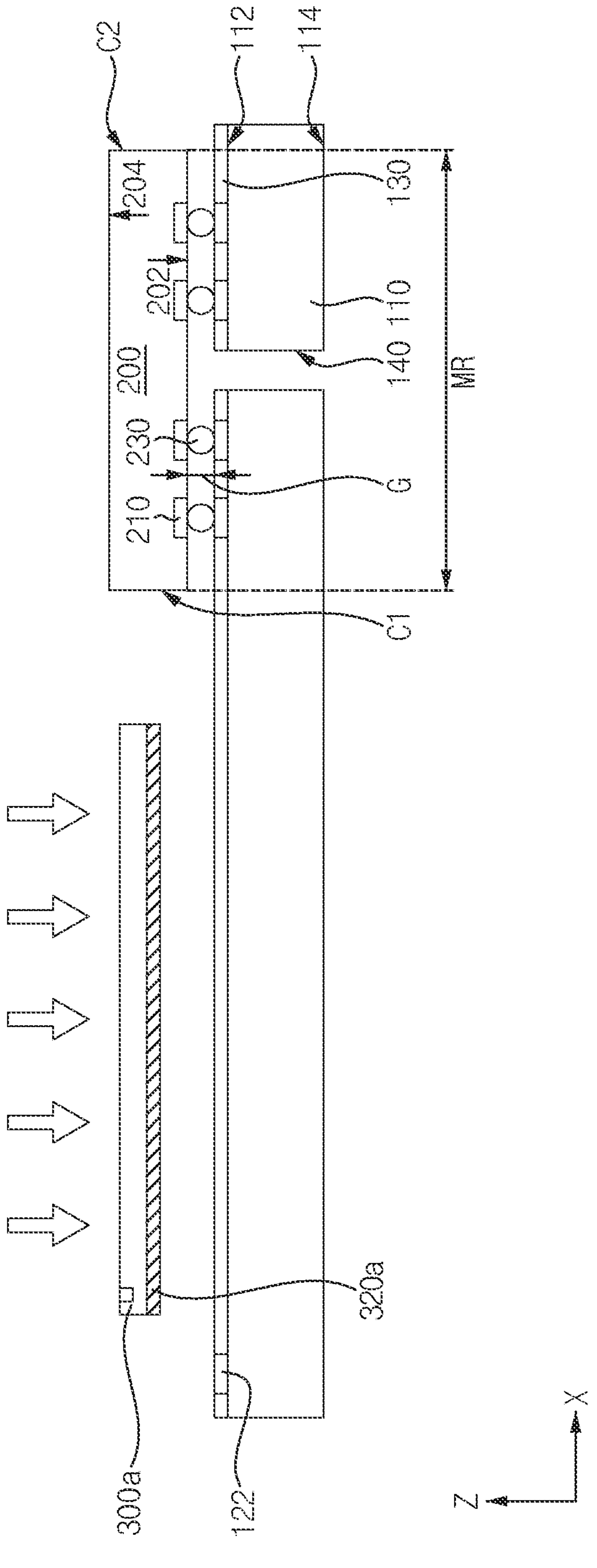
Figure 9:
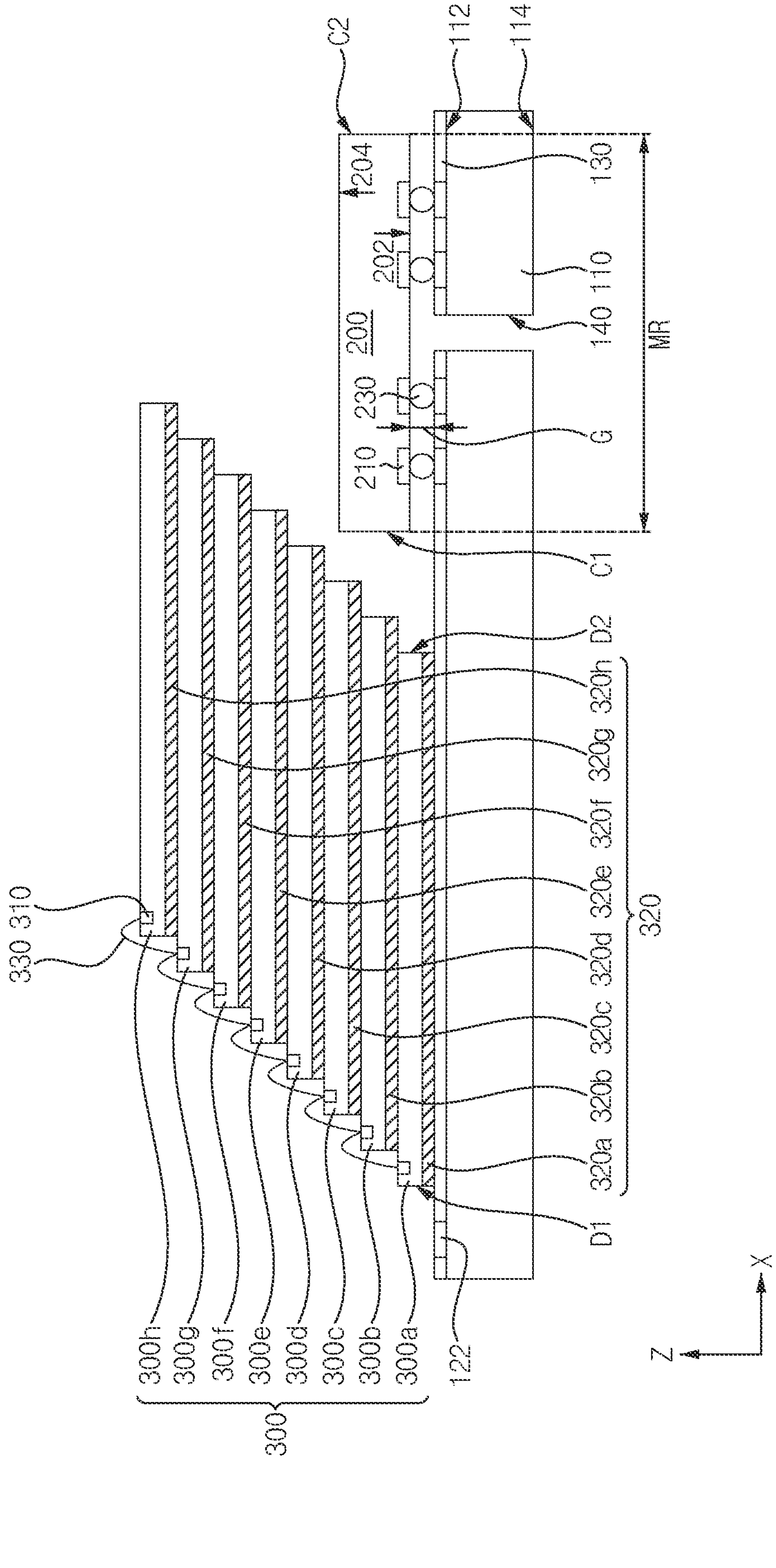

Referring to FIGS. 8 to 9, a plurality of second semiconductor chips 300 may be stacked on the package substrate 110.

As illustrated in FIG. 8, a lowest semiconductor chip **300*a* may be attached to the package substrate 110 using a first adhesive film 320*a*. As illustrated in FIG. 9, remaining chips 300*b*, 300*c*, 300*d*, 300*e*, 300*f*, 300*g* and 300*h* of the plurality of second semiconductor chips 300 may be sequentially attached on the lowest semiconductor chip 300*a* by second adhesive films 320*b*, 320*c*, 320*d*, 320*e*, 320*f*, 320*g* and 320*h***, respectively.

The plurality of second semiconductor chips may include a memory chip including a memory circuit. For example, the plurality of second semiconductor chips may include volatile memory devices such as SRAM devices, DRAM devices, etc. and nonvolatile memory devices such as flash memory devices, PRAM devices, MRAM devices, RRAM devices, etc.

In example embodiments, the lowest semiconductor chip **300*a* may be disposed such that a backside surface opposite to a front surface on which a plurality of second chip pads 310 are formed, that is, a non-active surface, faces the package substrate 110. When viewed from a plan view, the plurality of second semiconductor chips 300** may each have a rectangular shape having four sides.

For example, the first adhesive film **320*a* may be attached on the backside surface of the lowest semiconductor chip 300*a*, and the lowest semiconductor chip 300*a* to which the first adhesive film 320*a* is attached may be attached on the package substrate 110 by a thermal compression process. The lowest semiconductor chip 300*a* may be pressed onto the package substrate 110 by a die attaching tool, and then, may be heated to a high temperature by a heater block inside a support system that supports the package substrate 110**.

As illustrated in FIG. 9, the remaining chips 300*b*, 300*c*, 300*d*, 300*e*, 300*f*, 300*g* and 300*h* of a plurality of second semiconductor chips 300 may be sequentially attached on the lowest semiconductor chip 300*a* using the second adhesive films 320*b*, 320*c*, 320*d*, 320*e*, 320*f*, 320*g* and 320*h* such as a die attach film DAF by a die attach process.

The plurality of second semiconductor chips 300 may be disposed adjacent to the first side portion S1 of the package substrate 110. The plurality of second semiconductor chips 300 may be spaced apart from the first semiconductor chip 200 in the first direction (X direction). A planar area of each of the plurality of second semiconductor chips 300 may be greater than a planar area of the first semiconductor chip 200. When viewed from a plan view, some relatively highly arranged chips 300*e*, 300*f*, 300*g*, and 300*h* of the plurality of second semiconductor chips 300 may be disposed over the first semiconductor chip 200 and partially overlap with the first semiconductor chip 200.

The plurality of second semiconductor chips 300*a*, 300*b*, 300*c*, 300*d*, 300*e*, 300*f*, 300*g* and 300*h* may be sequentially offset aligned. For example, the plurality of second semiconductor chips 300 may be stacked in a cascade structure. The plurality of second semiconductor chips 300 may be sequentially offset aligned in the first direction (X direction) of the package substrate 110. For example, each second semiconductor chip 300 of the plurality of second semiconductor chips 300 may extend farther in the X direction toward the first semiconductor chip 200 than an underlying second semiconductor chip 300.

The number, sizes, arrangements, etc. of the plurality of second semiconductor chips are provided as examples, and it will be understood that the present inventive concept is not limited thereto. Additionally, although only a few second chip pads are illustrated in the figures, the structures, shapes, and arrangements of the second chip pads are provided as examples, and it will be understood that the present inventive concept is not limited thereto.

Then, the plurality of second semiconductor chips 300 may be electrically connected to the package substrate 110 via a plurality of second conductive connection members 330.

In particular, the plurality of second chip pads 310 of the plurality of second semiconductor chips 300 may be connected to the plurality of second substrate pads 122 on the upper surface 112 of the package substrate 110 via a plurality of bonding wires as the second conductive connection members 330.

Figure 10:
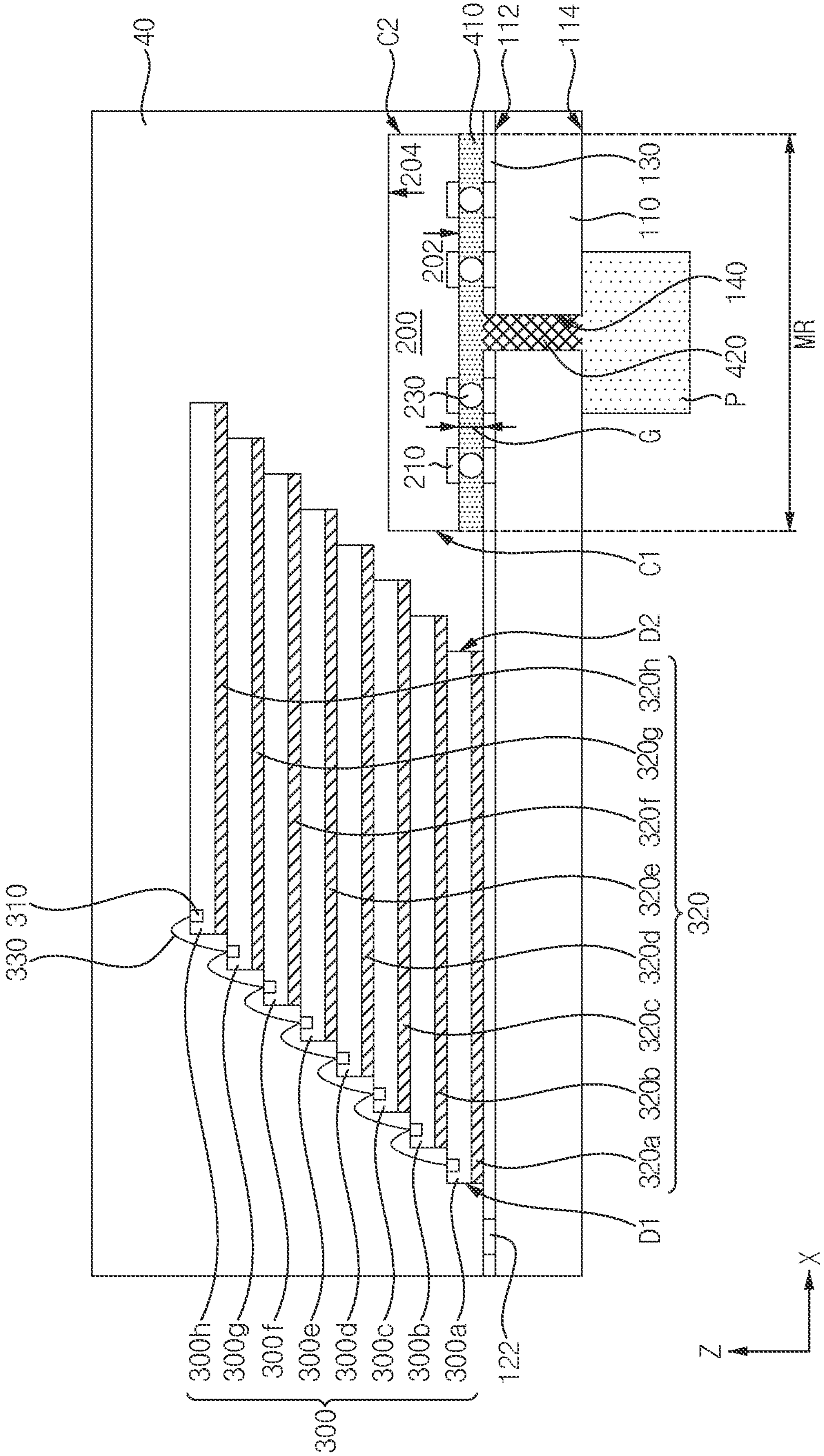
Figure 11:
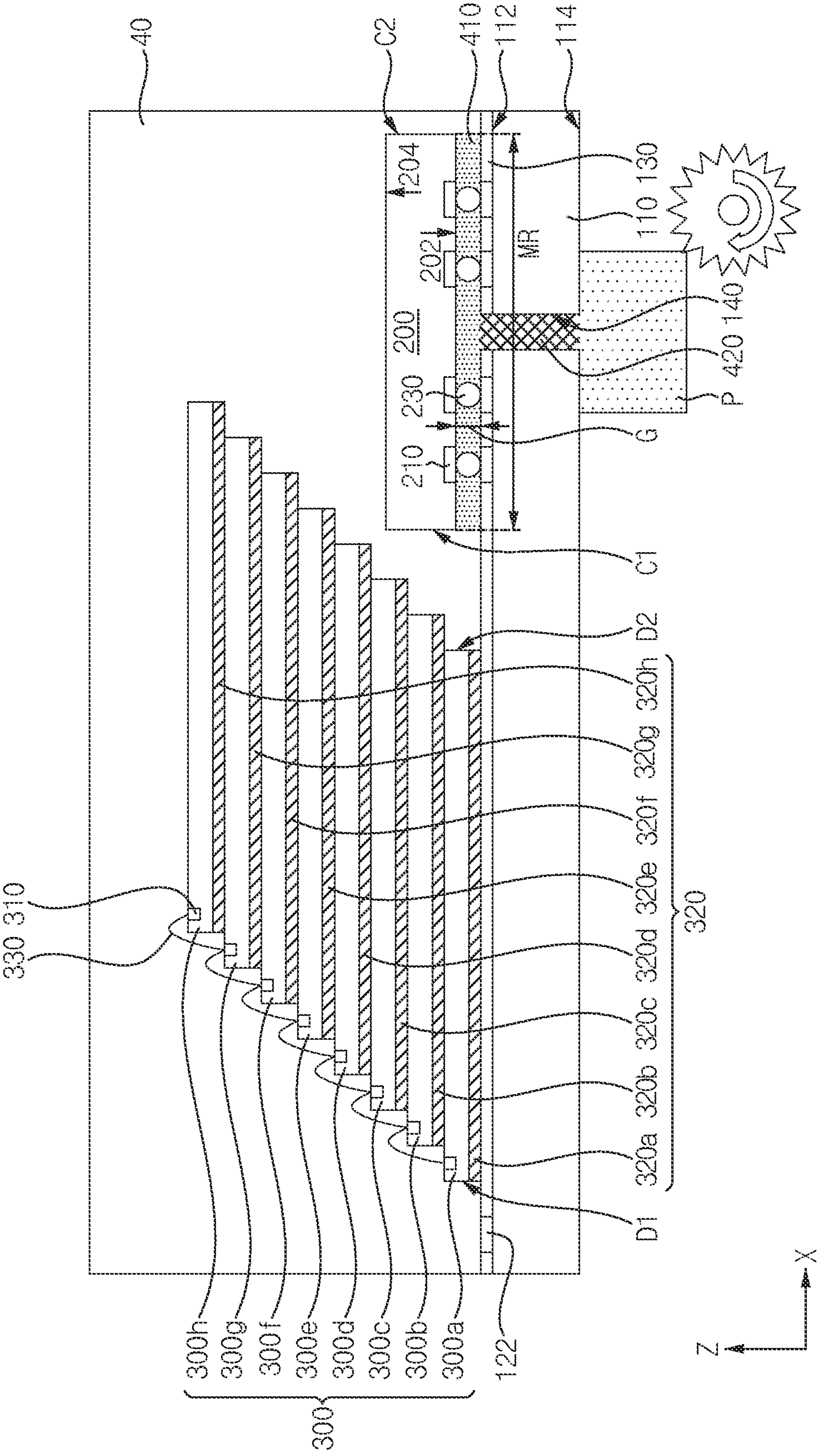
Figure 12:
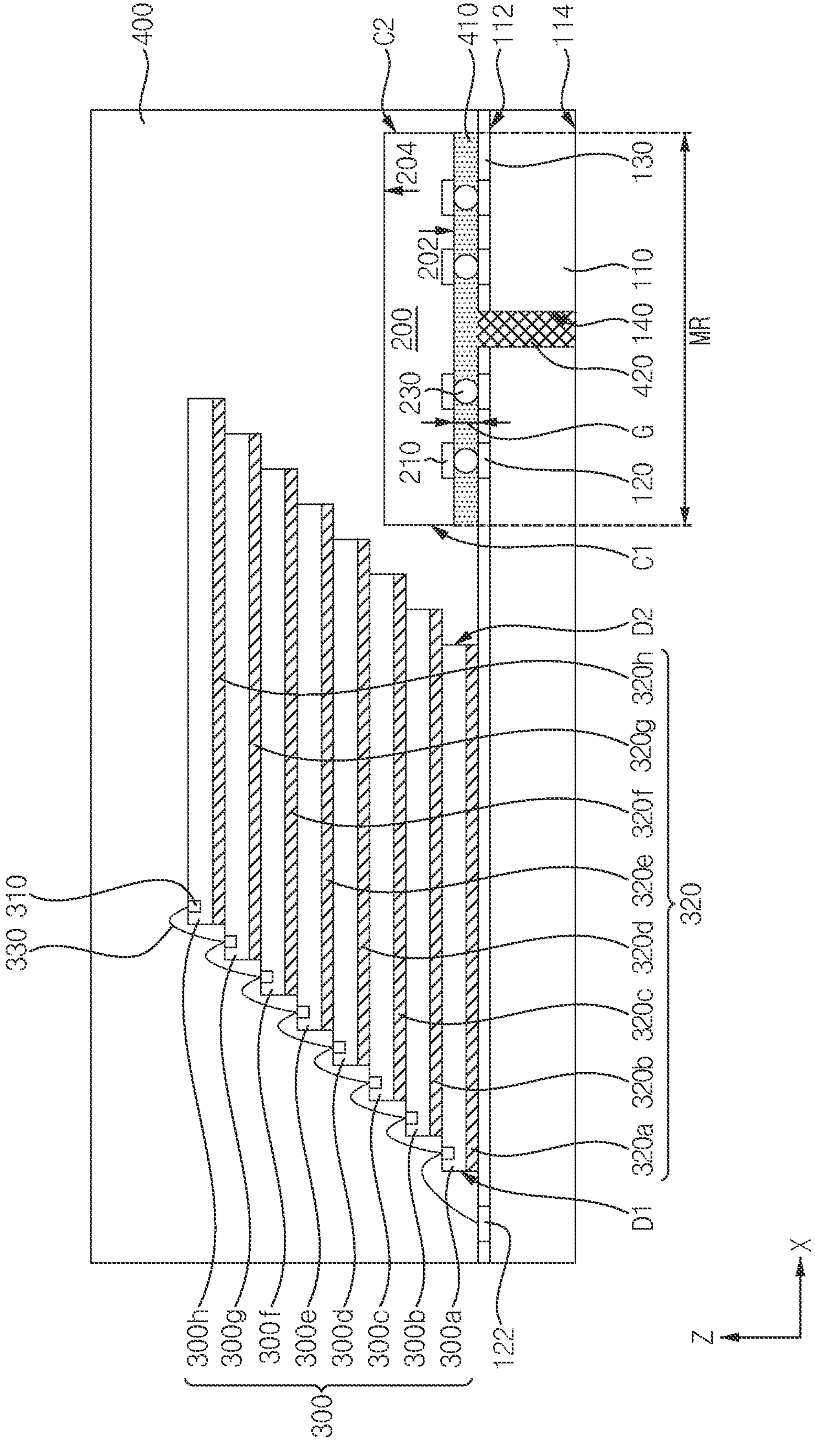

Referring to FIGS. 10 to 12, a sealant 40 may be formed on the upper surface 112 of the package substrate 110 to cover the first semiconductor chip 100, the plurality of second semiconductor chips 200 and the plurality of bonding wires 330. The sealant may be or include a thermosetting resin, for example, epoxy molding compound EMC.

As illustrated in FIG. 10, the sealant 40 may be formed by a transfer molding process. In the transfer molding process, the sealant 40 in a liquid state may flow in a space between the package substrate 110 and the first semiconductor chip 200, and may be cured to fill the gap (G) between the package substrate 110 and the first semiconductor chip 200. A portion of the sealant 40 in the liquid state may flow between the package substrate 110 and the first semiconductor chip 200, and may sufficiently fill an inside of the opening 140 of the package substrate 110, and the sealant 40 in the liquid state may be solidified on the lower surface 114 of the package substrate 110 to form a protrusion P on the lower surface 114 of the package substrate 110.

A first portion 410 of the sealant 40 may fill the gap G between the lower surface 202 of the first semiconductor chip 200 and the upper surface 112 of the package substrate 110 by a molded underfill process MUF. Thus, the first portion 410 of the sealant 400 may serve as underfill below the first semiconductor chip 200 that is mounted by the flip chip bonding method.

A second portion 420 of the sealant 40 may extend through the opening 140 disposed below the first semiconductor chip 200. Thus, the opening 140 may prevent voids from being formed when forming the sealant 40. A portion of the sealant 40 may fill the opening 140 and another portion of the sealant 40 may be exposed through the opening 140, protruding from the lower surface 114 of the package substrate 110, to form the protrusion P.

As illustrated in FIGS. 11 and 12, the sealant 400 may be formed by removing the protrusion P exposed to outside through the opening 140 of the package substrate 110.

In particular, among the sealing materials 40, the protrusion P exposed to the outside through the opening 140 of the package substrate 110 may be removed to form the sealant 400 such that a lower surface of the second portion 420 of the sealant 400 may be coplanar with the lower surface 114 of the package substrate 110.

For example, among the sealing materials 40, the protrusion P exposed to outside may be removed by a grinding process or a laser process.

Figure 13:
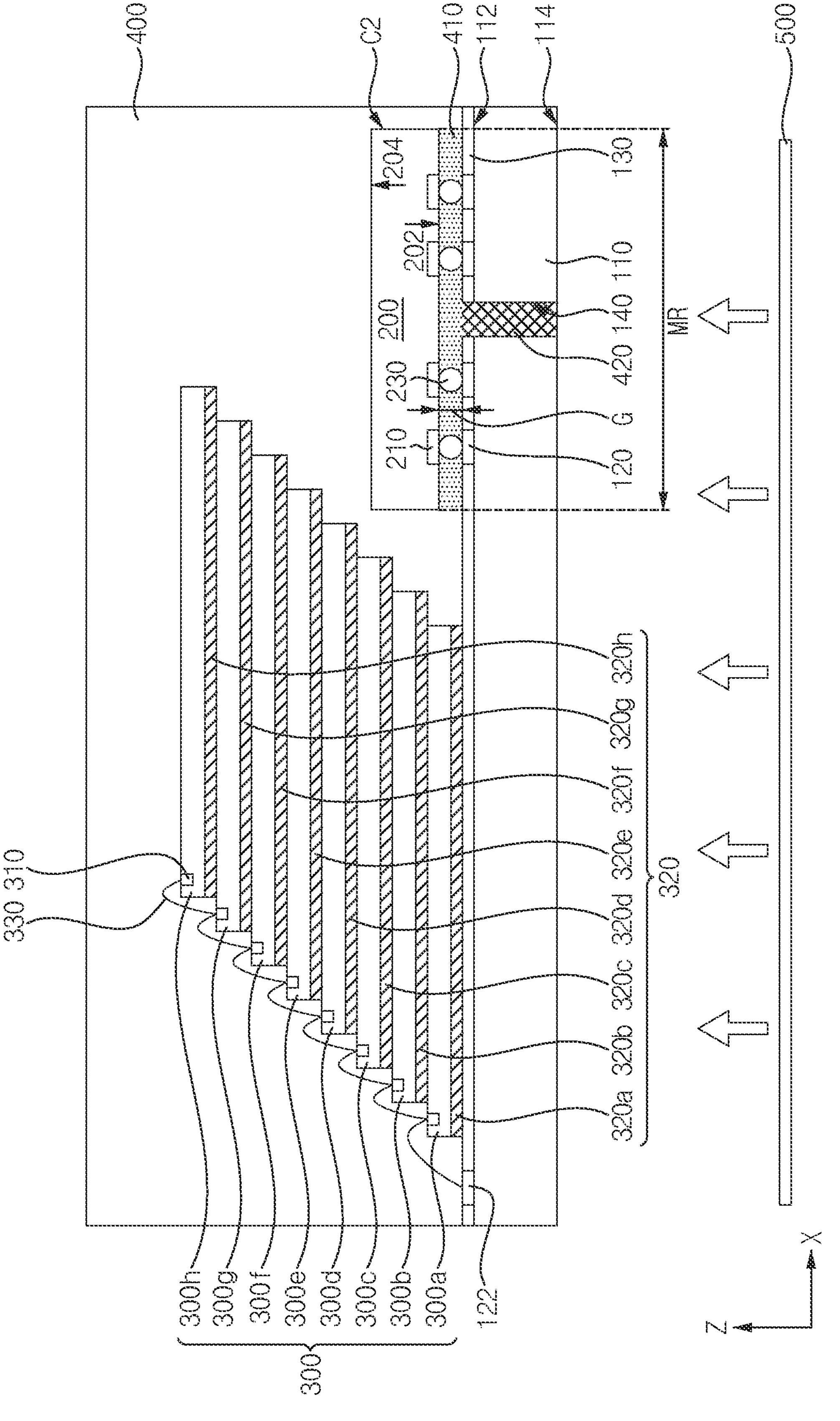
Figure 14:
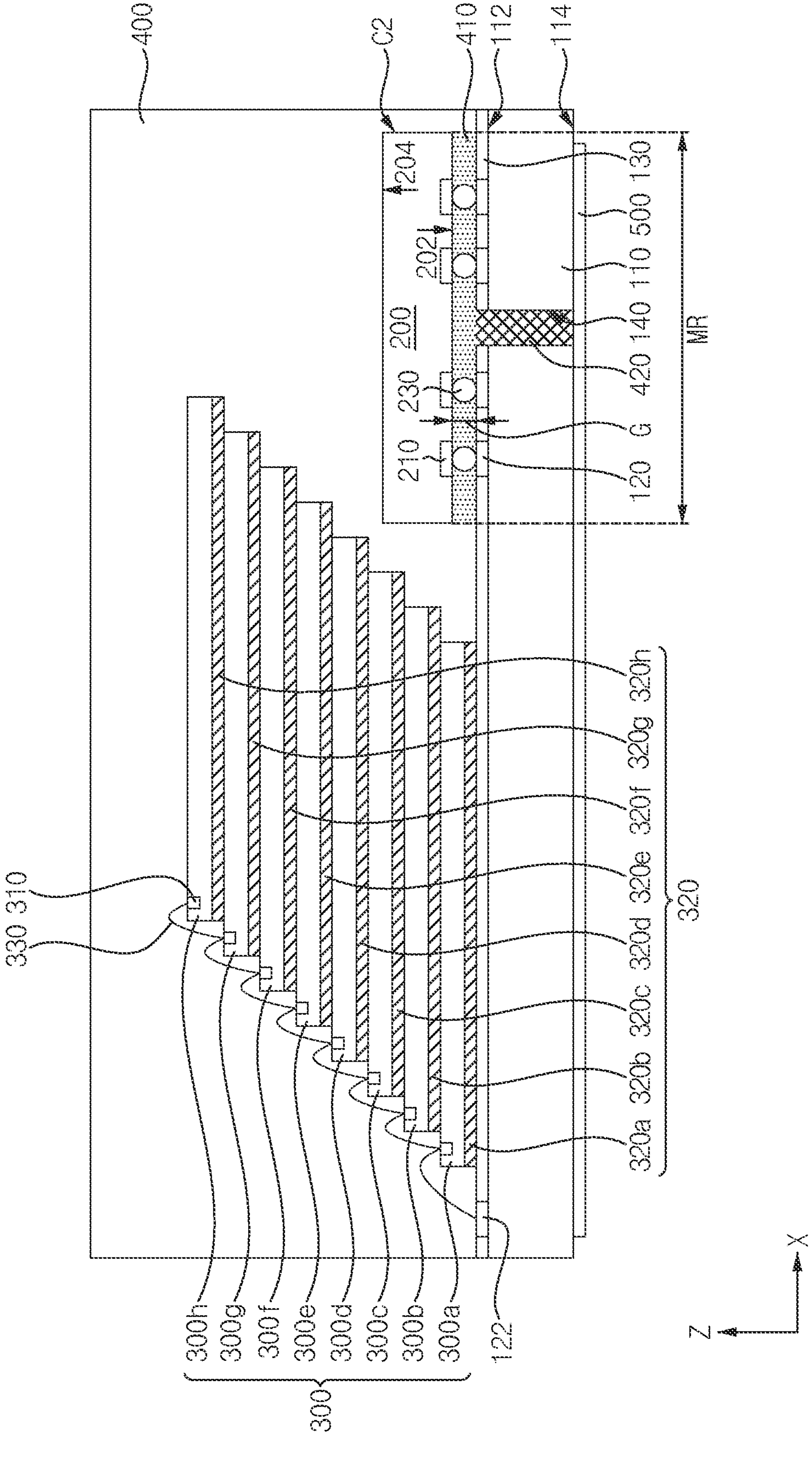

Referring to FIG. 13, a taping film 500 may be attached on the lower surface 114 of the package substrate 110 to prevent a leakage of the sealant, and thereby complete the semiconductor package 100 of FIG. 1.

The taping film 500 may be disposed on the lower surface 114 of the package substrate 110 to cover the lower surface of the second portion 420 of the sealant 400 extending through the opening 140. Specifically, the taping film 500 may have a rectangular shape when viewed from a plan view. The taping film 500 may be attached on the lower surface 114 of the package substrate 110 to cover the sealant 400 exposed in the opening 140. The taping film 500 may cover at least the entire lower surface of the second portion 420 of the sealant 400 that is exposed in the opening 140.

Hereinafter, a memory card 10 on which the semiconductor package of FIG. 1 is mounted will be described.

Figure 15:
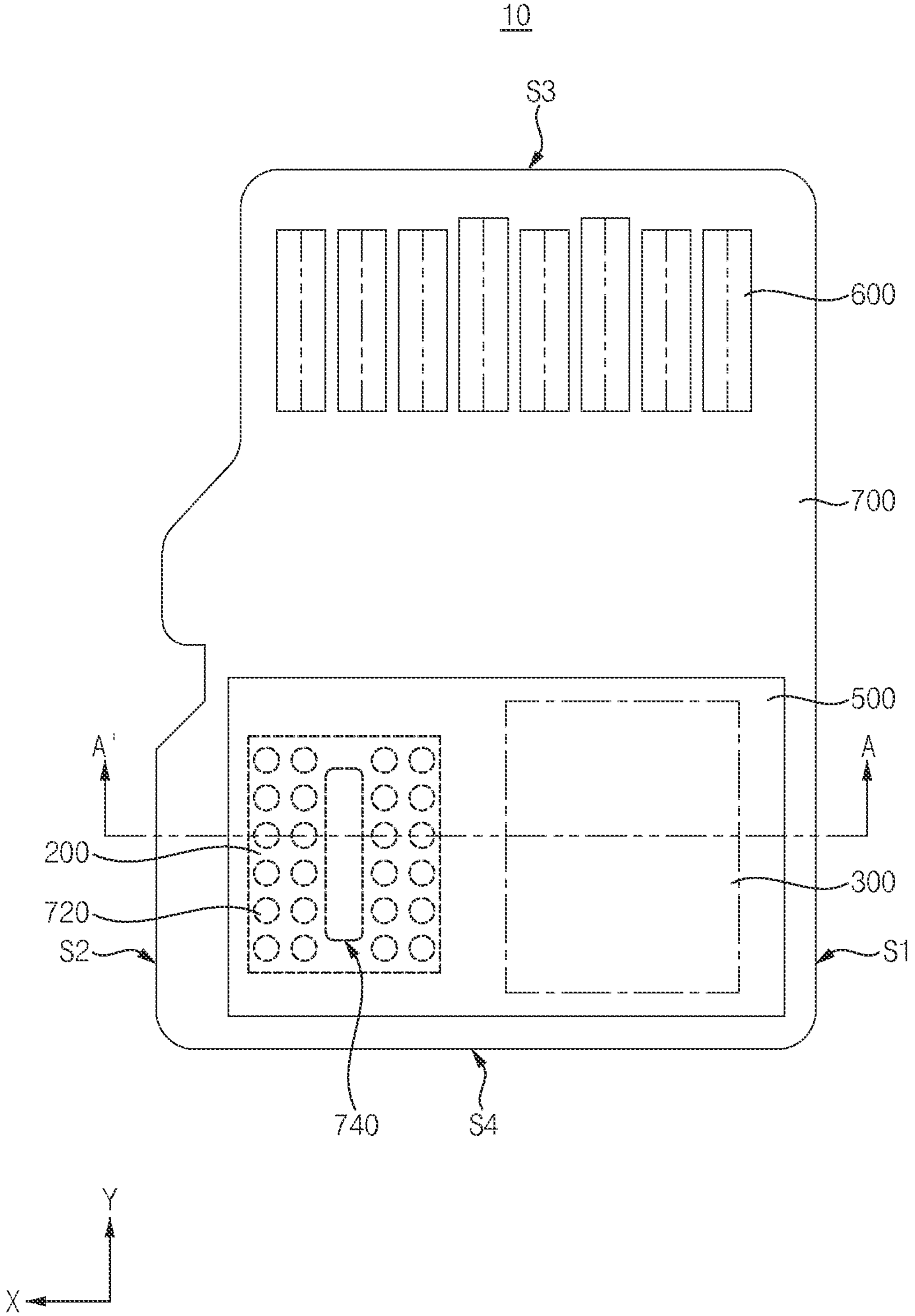
FIG. 15, FIG. 17 and FIG. 18 are plan views illustrating a memory card in accordance with example embodiments.
Figure 16:
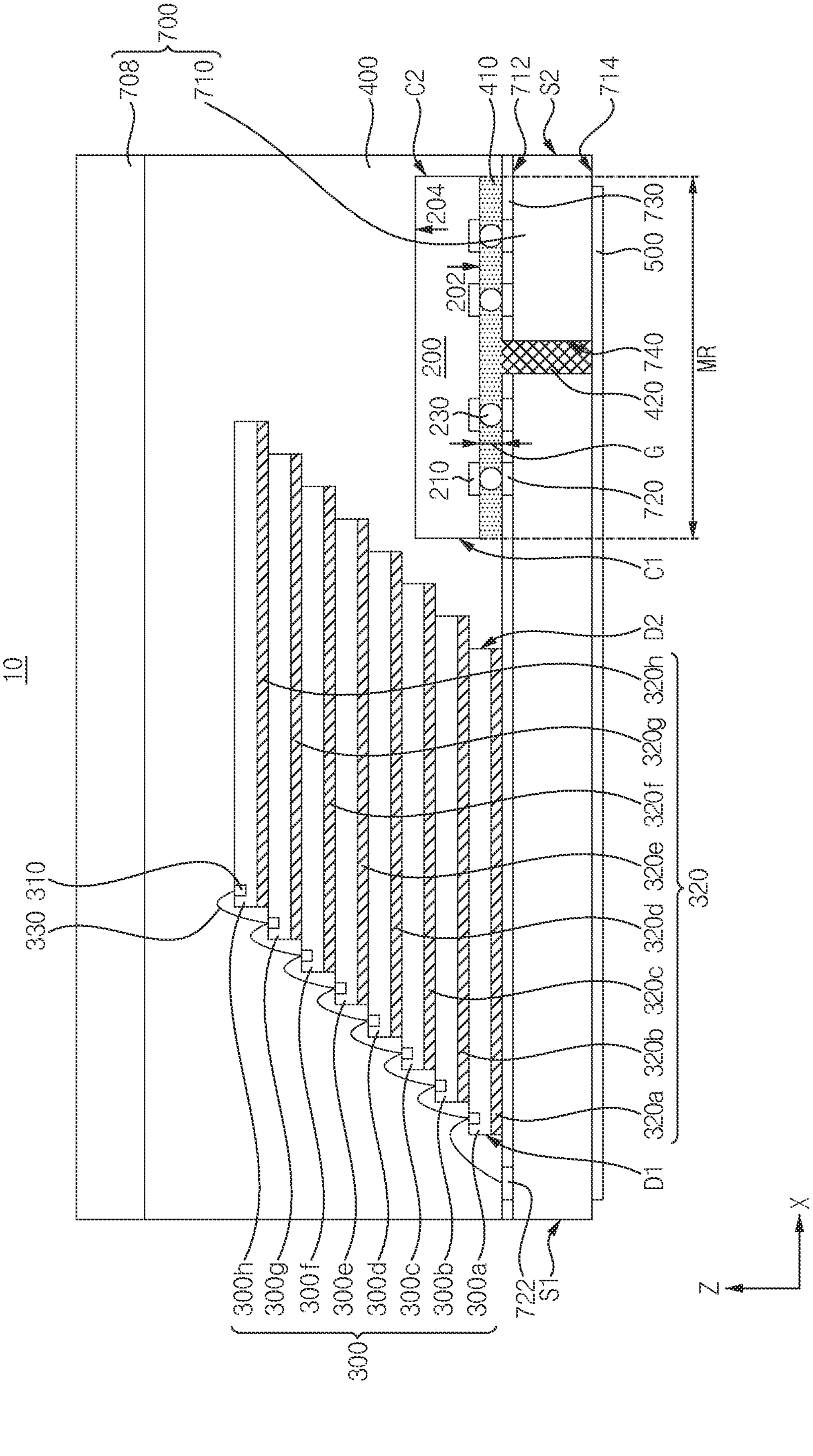
FIG. 16 is a cross-sectional view taken along the line A-A' in FIG. 15.
Figure 17:
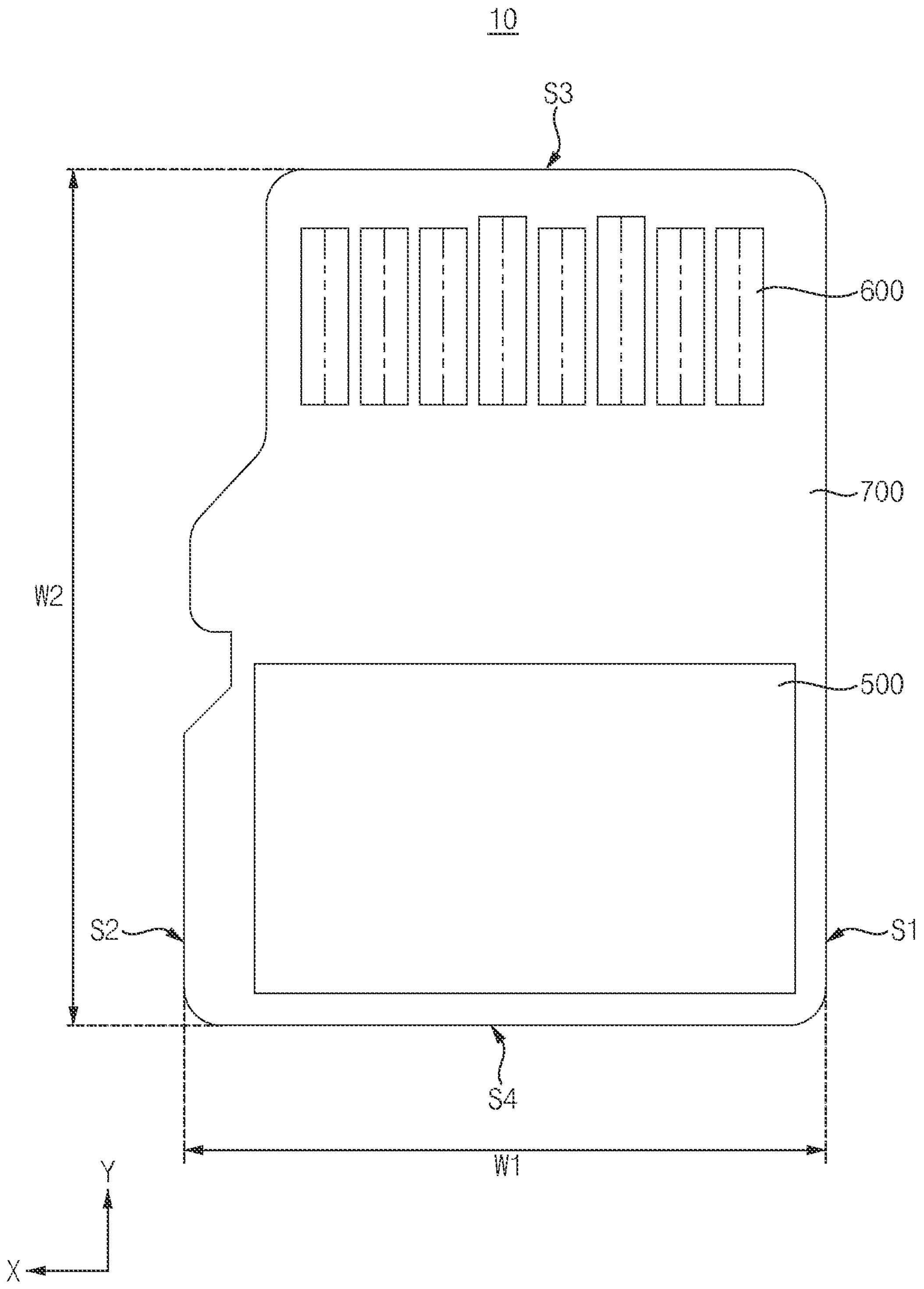
Figure 18:
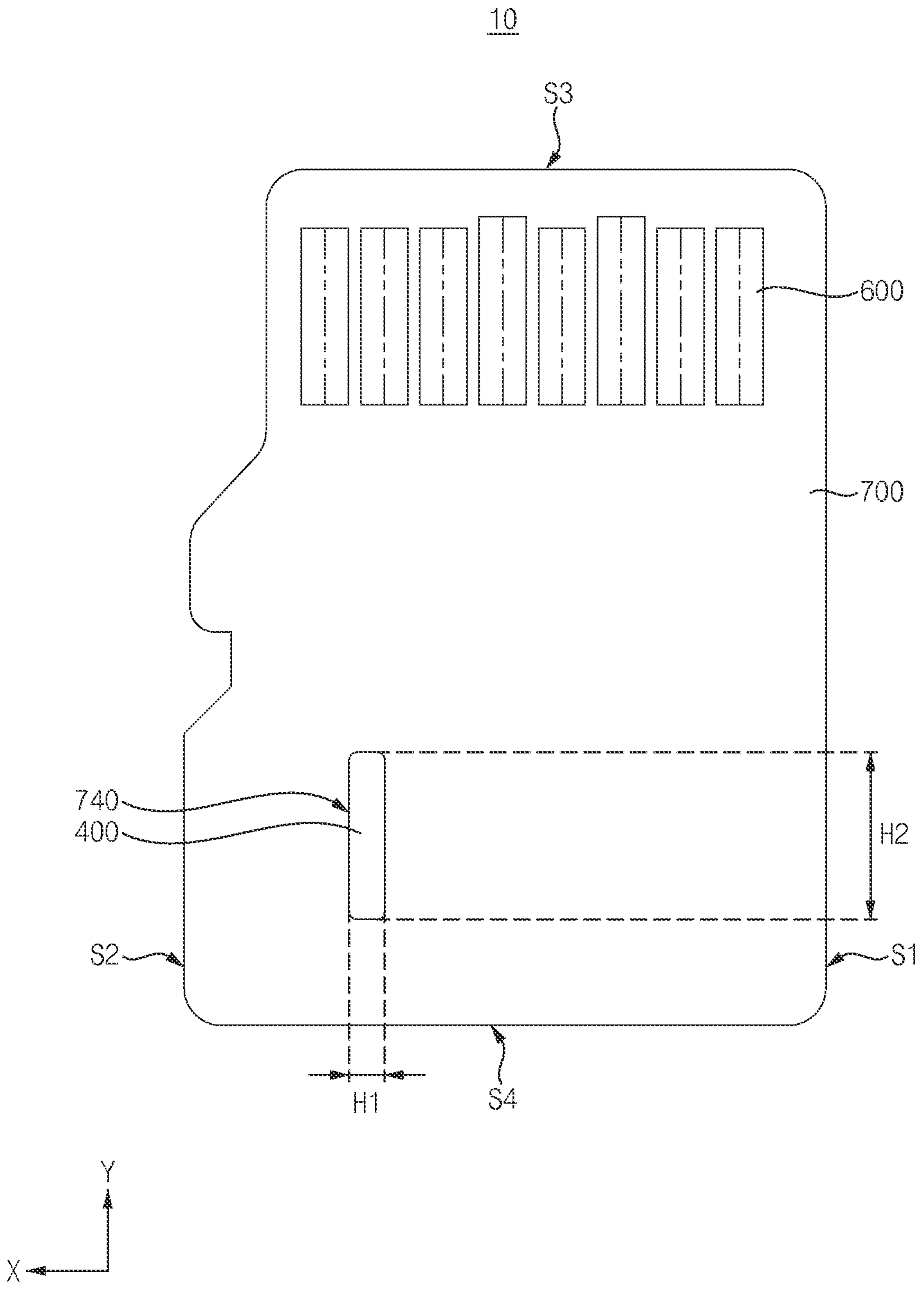

FIGS. 15 to 18 are views illustrating a memory card in accordance with example embodiments. FIGS. 15, 17 and 18 are plan views illustrating a memory card in accordance with example embodiments. FIG. 16 is a cross-sectional view taken along the line A-A' in FIG. 15. FIG. 17 is a rear view illustrating a taping film attached on the memory card in FIG. 15. FIG. 18 is a plan view illustrating the memory card of FIG. 17 wherein the taping film is omitted.

Referring to FIGS. 15 to 18, a memory card 10 may include at least one first semiconductor chip 200, a plurality of second semiconductor chips 300, a sealant 400, a taping film 500, external connection members 600 and an external case 700. The external case 700 may have an upper case 708 and a substrate 710. The memory card 10 may further include first conductive connection members 230 that electrically connect the first semiconductor chip 200 to the package substrate 710. In addition, the memory card 10 may further include second conductive connection members 330 that electrically connect the plurality of second semiconductor chips 300 to the package substrate 710.

The memory card 10 may be substantially the same as the semiconductor package described with reference to FIG. 1 except for the external case 700 and the plurality of the external connection members 600. Thus, the same reference numerals denote the same components, and repeated description of the same components will be omitted.

In example embodiments, the external case 700 may be a case having the upper case 708 and the substrate 710. As illustrated in FIG. 16, the upper case 708 may be disposed at a top of the memory card 10 in a third direction (Z direction), and the substrate 710 may be disposed at bottom of the memory card 10 in the third direction (Z direction).

The external case 700 may include a first side portion S1 and a second side portion S2 extending in a direction parallel with a second direction (Y direction) opposite to each other, and a third side portion S3 and a fourth side portion S4 extending in a direction parallel with a first direction (X direction) opposite to each other. The third side portion S3 may be an insertion portion so that the memory card 10 is inserted into an external device. A groove may be formed in the second side portion S2 adjacent to the third side portion S3 to insert and fasten the memory card 10. A first width W1 between the first side portion S1 and the second side portion S2 opposite to each other may be less than a second width W2 between the third side portion S3 and the fourth side portion S4 opposite to each other. For example, the memory card 10 may have a generally rectangular shape. One or more sides of the memory card 10 (for example, the second side portion S2) may include grooves and/or protrusions from the general rectangular shape.

The substrate 710 may be a substrate having an upper surface 712 and a lower surface 714 opposite to the upper surface 712. For example, the substrate 710 may be or include a printed circuit board (PCB), a flexible substrate, a tape substrate, etc. The printed circuit board may be a multilayer circuit board having vias and various circuits therein. The substrate 710 may include internal wires that serve as channels for electrical connection between the first semiconductor chip 200 and the plurality of second semiconductor chips 300.

The substrate 710 may have a chip mounting region MR disposed on a region adjacent to the second side portion S2. The chip mounting region MR may be disposed at a relatively low portion in the third direction (Z direction).

The substrate 710 may have a plurality of third substrate pads 720 disposed in a chip mounting region MR and a plurality of fourth substrate pads 722 disposed along the first side portion S1 of the substrate 710. The plurality of third substrate pads 720 and the plurality of fourth substrate pads 722 may be respectively connected to the wires. The wires may extend in the upper surface 712 of the substrate 710 or inside the substrate 710. For example, at least a portion of the wire may be used as the substrate pad as a landing pad.

Although some substrate pads are illustrated, the number, shapes and locations of the substrate pads are illustrated as examples, and thus, the invention is not limited thereto. Since the wirings as well as the substrate pads are well known in the art to which the present inventive concept pertains, illustration and description concerning the above elements will be omitted.

A second insulation layer 730 may be formed on the upper surface 712 of the substrate 710 to expose the third and fourth substrate pads 720 and 722. The second insulation layer 730 may cover the entire upper surface 712 of the substrate 710 except for the third and fourth substrate pads 720 and 722. For example, the second insulation layer may be or include a solder resist.

As illustrated in FIG. 15, At least one substrate opening 740 may be provided in the chip mounting region MR to penetrate the substrate 710. The substrate opening 740 may be provided at the bottom in the second direction (Y direction) and may be disposed along the second side portion S2 to be adjacent to the second side portion S2.

For example, the substrate opening 740 may have a rectangular, circular or oval shape, when viewed from a plan view.

For example, the substrate opening 740 may have a rectangular shape. A first width H1 in the first direction (X direction) of the substrate opening 740 may be smaller than a second width H2 in the second direction (Y direction) of the substrate opening 740. Corners of the substrate opening 740 may have a curved shape. The second width H2 in the second direction (Y direction) of the substrate opening 740 may be less than or equal to a first length L2 in the second direction (Y direction) of the first semiconductor chip 100. In addition, the first width H1 of the substrate opening 740 may be within a range of 0.1 mm to 0.3 mm.

The substrate opening 740 may be disposed to penetrate the substrate 710. The substrate opening 740 may be disposed in a central portion of the chip mounting region MR. The substrate opening 740 may be disposed below the first semiconductor chip 200. Although one substrate opening is illustrated, the number, shapes and locations of substrate openings is illustrated as an example, and thus, the invention is not limited thereto.

In example embodiments, the first semiconductor chip 200 may be mounted on the chip mounting region MR of the substrate 710. The first semiconductor chip 200 may be mounted on the substrate 710 via the plurality of first conductive connection members 230. The first semiconductor chip 200 may be disposed such that a front surface 202 on which a plurality of first chip pads 210 are formed, that is, an active surface, faces the substrate 710.

The first semiconductor chip 200 may be mounted on the substrate 710 by a flip chip bonding method. The plurality of first chip pads 210 of the first semiconductor chip 200 may be electrically connected to the plurality of third substrate pads 720 of the substrate 710 by the plurality of conductive bumps 230, for example, solder bumps. A gap G may be formed between the second insulation layer 730 on the upper surface 712 of the substrate 710 and the front surface 202 of the first semiconductor chip 200 by the plurality of conductive bumps 230.

In example embodiments, a plurality of second semiconductor chips 300 may be sequentially attached on the substrate 710 using a plurality of adhesive films 320 such as a die attach film (DAF) by a die attach process.

The plurality of second semiconductor chips 300*a*, 300*b*, 300*c*, 300*d*, 300*e*, 300*f*, 300*g* and 300*h* may be disposed such that a backside surface opposite to a front surface on which the plurality of second chip pads 310 are formed, that is, a non-active surface, faces the substrate 710. When viewed from a plan view, the plurality of second semiconductor chips 300 may have a quadrangular shape having four sides.

For example, the plurality of adhesive films 320*a*, 320*b*, 320*c*, 320*d*, 320*e*, 320*f*, 320*g* and 320*h* may be attached to the backside surface of the plurality of second semiconductor chips 300*a*, 300*b*, 300*c*, 300*d*, 300*e*, 300*f*, 300*g* and 300*h*, respectively, and the plurality of second semiconductor chips 300*a*, 300*b*, 300*c*, 300*d*, 300*e*, 300*f*, 300*g* and 300*h* to which the plurality of adhesive films 320*a*, 320*b*, 320*c*, 320*d*, 320*e*, 320*f*, 320*g* and 320*h* are attached may be sequentially attached on the substrate 710 by a thermal compression process. The plurality of second semiconductor chips 300 may be pressed onto the substrate 710 by a die attaching tool, and then may be heated to a high temperature by a heater block inside a support system that supports the substrate 710

The plurality of second semiconductor chips 300 may be sequentially offset aligned in the first direction (X direction) of the substrate 710.

The plurality of second semiconductor chips 300 may be electrically connected to the substrate 710 via the plurality of second conductive connection members 330. Specifically, the plurality of second chip pads 310 of the plurality of second semiconductor chips 300 may be connected to the plurality of fourth substrate pads 722 on the upper surface 712 of the substrate 710 via a plurality of bonding wires as the second conductive connection members 330.

In example embodiments, the sealant 400 may cover the first semiconductor chip 200, the plurality of second semiconductor chips 300 and the plurality of bonding wires 330 on the upper surface 712 of the substrate 710.

The first portion 410 of the sealant 400 may fill the gap G between the lower surface 202 of the first semiconductor chip 200 and the upper surface 712 of the substrate 710. The first portion 410 of the sealant 400 may serve as underfill below the first semiconductor chip 200 that is mounted by the flip chip bonding method.

The second portion 420 of the sealant 400 may extend through the substrate opening 740 of the substrate 710 disposed below the first semiconductor chip 200. The second potion 420 of the sealant 400 may fill the opening 740 and may extend through the opening 740 such that a lower portion of the second portion 420 is exposed in the opening 740. A lower surface of the second portion 420 of the sealant 400 that fills an interior of the substrate opening 740 may be coplanar with the lower surface 714 of the substrate 710.

In example embodiments, the taping film 500 may be disposed on the lower surface 714 of the substrate 710 to cover the lower surface of the second portion 420 of the sealant 400 that extends through the substrate opening 740. For example, the taping film may be or include a polymer synthetic resin.

In particular, the taping film 500 may be attached on the lower surface 714 of the substrate 710 to cover the lower surface of the second portion 420 of the sealant 400 and may be disposed on a region adjacent to the fourth side portion S4 of the substrate 710 (see, e.g., FIG. 15). However, the inventive concept is not limited thereto, and the taping film 500 may be positioned under the substrate opening 740 regardless of the position of the substrate opening 740.

For example, the taping film 500 may have a rectangular shape when viewed from a plan view. The taping film 500 may cover at least the entire lower surface of the second portion 420 of the sealant 400 that is exposed in the substrate opening 740.

In example embodiments, the plurality of external connection members 600 may be arranged in a row along the third side portion S3 adjacent to the insertion portion inserted for connection to an external device, that is, the third side S3.

The plurality of external connection members 600 may be electrically connected to the first semiconductor chip 200 and the plurality of second semiconductor chips 300 mounted on a lower part of the substrate 710 to serve to transmit and receive signals with external devices. The plurality of external connection members 600 may have a rectangular shape with same or different sizes from each other.

As mentioned above, the memory card 10 may include the first semiconductor chip 200, the plurality of second semiconductor chips 300, the sealant 400, the taping film 500, the plurality of external connection members 600 and the external case 700. The external case 700 may have the upper case 708 and the substrate 710. The memory card 10 may further include the plurality of first conductive connection members 230 electrically connecting the first semiconductor chip 200 to the package substrate 710. In addition, the memory card 10 may further include the plurality of second conductive connection members 330 electrically connecting a plurality of second semiconductor chips 300 to the package substrate 710.

The first portion 410 of the sealant 400 may fill the gap G between the lower surface 202 of the first semiconductor chip 200 connected in a flip chip bonding method and the upper surface 712 of the substrate 710. The substrate 710 may have the at least one substrate opening 740 in the chip mounting region MR to penetrate the substrate 710. The second portion 420 of the sealant 400 may fill the interior of the substrate opening 740 provided below the first semiconductor chip 200

Accordingly, the second portion 420 of the sealant 400 may fill the gap G between the lower surface 202 of the first semiconductor chip 200 and the upper surface 712 of the package substrate 710 to extend through the interior of the opening 740, to thereby serve as an underfill as well as a sealant. Because there is no need for an additional area for a dispensing area for underfill and a Solder Resist dam, it may be possible to efficiently use an interior space of the package. Thus, it may be possible to implement a high-capacity package and secure a process margin.

Figure 19:
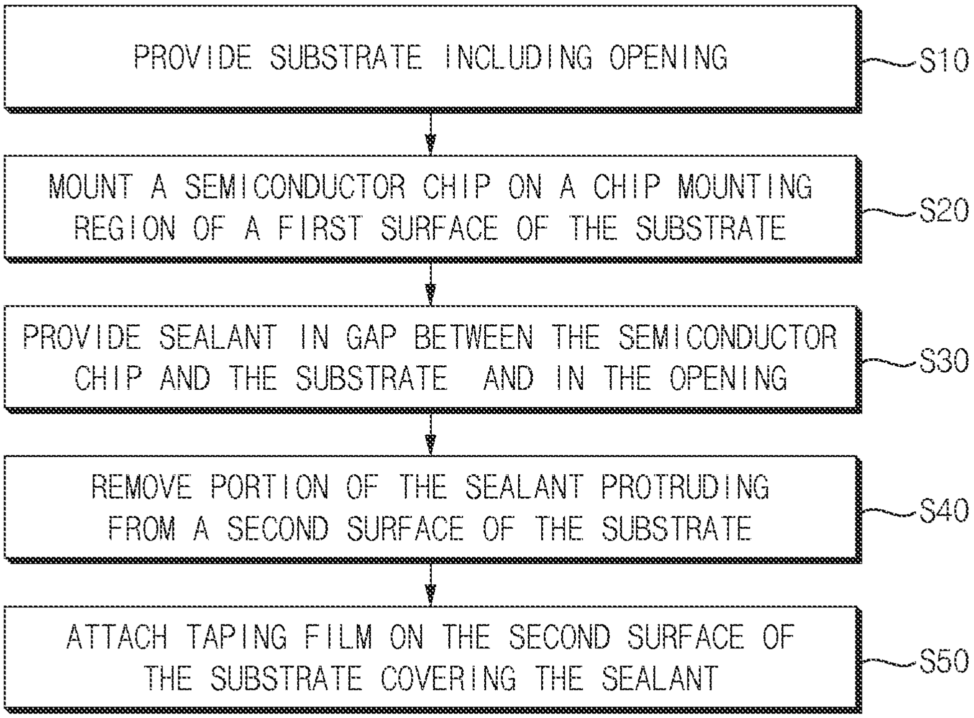
FIG. 19 is a flow chart showing a method of manufacturing a semiconductor package in accordance with example embodiments.

FIG. 19 shows a method of manufacturing a semiconductor package in accordance with example embodiments.

At step S10, a substrate (e.g., the package substrate 110 described above) may be provided including an opening in a chip mounting region of the substrate, the chip mounting region being on a first surface of the substrate.

At step S20, a semiconductor chip (e.g., the first semiconductor chip 200 described above) may be mounted on the chip mounting region of the substrate.

At step S30, a sealant (e.g., the sealant 400 described above) may be provided in a gap between the semiconductor chip and the substrate and in the opening.

At step S40, a portion of the sealant may be removed that protrudes from a second surface of the substrate that is opposite to the first surface.

At step S50, a taping film (e.g., the taping film 500 described above) be attached on the second surface of the substrate to cover the sealant that is located in the opening.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments.

What is claimed is:

1. A semiconductor package, comprising:
- a package substrate, the package substrate having a first opening in a chip mounting region of the package substrate;
- a first semiconductor chip mounted in the chip mounting region on an upper surface of the package substrate;
- a plurality of second semiconductor chips sequentially stacked on the upper surface of the package substrate and spaced apart from the first semiconductor chip in a first horizontal direction;
- a sealant covering the first semiconductor chip and the plurality of second semiconductor chips on the package substrate, the sealant filling a gap between the first semiconductor chip and the package substrate and filling an interior of the first opening of the package substrate; and
- a taping film attached on a lower surface of the package substrate to cover at least a portion of the sealant exposed in the first opening.

2. The semiconductor package of claim 1, wherein a lower surface of a portion of the sealant filling the interior of the first opening is coplanar with the lower surface of the package substrate.

3. The semiconductor package of claim 1, wherein the package substrate includes a plurality of substrate pads in the chip mounting region on the upper surface of the package substrate,
- wherein the first semiconductor chip includes a plurality of chip pads and a plurality of conductive bumps respectively disposed between the plurality of substrate pads and the plurality of chip pads.

4. The semiconductor package of claim 1, wherein a lowest semiconductor chip among the plurality of second semiconductor chips has a first side adjacent to the first semiconductor chip,
- wherein the first semiconductor chip has a second side adjacent to the first side,
- and
- wherein an entire region between the first side and the second side is filled by a portion of the sealant.

5. The semiconductor package of claim 1, wherein a portion of the plurality of second semiconductor chips partially overlap the first semiconductor chip when viewed in a plan view.

6. The semiconductor package of claim 1, wherein a width of the first opening in the first horizontal direction is smaller than a width of the first opening in a second horizontal direction perpendicular to the first horizontal direction.

7. The semiconductor package of claim 6, wherein the width of the first opening in the second horizontal direction is less than or equal to a length of the first semiconductor chip in the second horizontal direction.

8. The semiconductor package of claim 1, wherein the package substrate has a plurality of openings and each of the plurality of openings is a via hole, the via holes being arranged in a row along a second horizontal direction perpendicular to the first horizontal direction.

9. The semiconductor package of claim 8, wherein a diameter of each of the via holes is within a range of 0.1 mm to 0.4 mm.

10. The semiconductor package of claim 1, wherein the plurality of second semiconductor chips are sequentially attached to the upper surface of the package substrate by adhesive films, respectively.

11. A semiconductor package, comprising:
- a package substrate having a first opening in a chip mounting region and a plurality of first substrate pads in the chip mounting region, the package substrate having a plurality of second substrate pads in a region surrounding the chip mounting region;
- a first semiconductor chip mounted on the chip mounting region and having a plurality of first chip pads;
- a plurality of first conductive connection members electrically connecting the plurality of first chip pads to the plurality of the first substrate pads, respectively;
- a plurality of second semiconductor chips stacked on an upper surface of the package substrate and having a front surface and a backside surface facing each other, each of the plurality of second semiconductor chips having a plurality of second chip pads disposed on the front surface;
- a plurality of adhesive films, each of the plurality of adhesive films attached to the backside surface of each of the plurality of second semiconductor chips;
- a plurality of second conductive connection members electrically connecting the plurality of second chip pads to the plurality of the second substrate pads, respectively; and
- a sealant covering the first semiconductor chip, the plurality of second semiconductor chips and the second conductive connection members on the package substrate, the sealant filling a gap between the first semiconductor chip and the package substrate and filling an interior of the first opening of the package substrate.

12. The semiconductor package of claim 11, wherein a lower surface of a portion of the sealant filling the interior of the first opening is coplanar with a lower surface of the package substrate.

13. The semiconductor package of claim 11, further comprising a taping film attached on a lower surface of the package substrate covering at least a portion of the sealant exposed in the first opening.

14. The semiconductor package of claim 11, wherein a lowest semiconductor chip among the plurality of second semiconductor chips has a first side adjacent to the first semiconductor chip,
- wherein the first semiconductor chip has a second side adjacent to the first side,
- and
- wherein an entire region between the first side and the second side is filled by a portion of the sealant.

15. The semiconductor package of claim 11, wherein a portion of the plurality of second semiconductor chips partially overlap the first semiconductor chip when viewed in plan view.

16. The semiconductor package of claim 11, wherein a width of the first opening in a first direction is smaller than a width of the first opening in a second direction perpendicular to the first direction.

17. The semiconductor package of claim 16, wherein the width of the first opening in the second direction is less than or equal to a length of the first semiconductor chip in the second direction.

18. The semiconductor package of claim 11, wherein the first opening includes a plurality of via holes, the via holes being arranged in a row along a second direction perpendicular to a first direction.

19. The semiconductor package of claim 18, wherein a diameter of each of the plurality of the via holes is within a range of 0.1 mm to 0.4 mm.

20. A semiconductor package, comprising:

a package substrate having a first opening in a chip mounting region and a plurality of first substrate pads in the chip mounting region, the package substrate having a plurality of second substrate pads in a region excluding the chip mounting region;

a first semiconductor chip mounted on the chip mounting region and a plurality of first chip pads on the first semiconductor chip;

a plurality of first conductive connection members electrically connecting the plurality of first chip pads to the plurality of the first substrate pads, respectively;

a plurality of second semiconductor chips stacked on an upper surface of the package substrate and having a front surface and a backside surface facing each other, each of the plurality of second semiconductor chips having a plurality of second chip pads disposed on the front surface;

a plurality of adhesive films, each of the plurality of adhesive films attached to the backside surface of each of the plurality of the plurality of second semiconductor chips;

a plurality of second conductive connection members electrically connecting the plurality of second chip pads to the plurality of the second substrate pads, respectively;

a sealant covering the first semiconductor chip, the plurality of second semiconductor chips and the second conductive connection members on the package substrate, the sealant filling a gap between the first semiconductor chip and the package substrate and filling an interior of the first opening of the package substrate; and a taping film attached on a lower surface of the package substrate such that at least a portion of the sealant exposed in the first opening is covered, wherein a lower surface of a portion of the sealant filling the interior of the first opening is coplanar with the lower surface of the package substrate, wherein a width of the first opening in a first direction is smaller than a width of the first opening in a second direction perpendicular to the first direction, wherein the width of the first opening in the second direction is less than or equal to a length of the first semiconductor chip in the second direction.

* * * * *